United States Patent
Shin et al.

(10) Patent No.: US 9,379,122 B2
(45) Date of Patent: Jun. 28, 2016

(54) MEMORY DEVICE AND METHOD OF FABRICATING THE SAME

(71) Applicant: Samsung Electronics Co., Ltd., Suwon-si (KR)

(72) Inventors: Jin-Hyun Shin, Suwon-si (KR); Jae-Bok Baek, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/600,577

(22) Filed: Jan. 20, 2015

(65) Prior Publication Data

US 2015/0371996 A1     Dec. 24, 2015

(30) Foreign Application Priority Data

Jun. 19, 2014  (KR) ........................ 10-2014-0075034

(51) Int. Cl.
| | |
|---|---|
| H01L 27/115 | (2006.01) |
| H01L 29/788 | (2006.01) |
| H01L 29/06 | (2006.01) |
| H01L 21/764 | (2006.01) |
| G11C 5/06 | (2006.01) |
| G11C 16/04 | (2006.01) |

(52) U.S. Cl.
CPC .......... H01L 27/11524 (2013.01); G11C 5/063 (2013.01); G11C 16/0483 (2013.01); H01L 21/764 (2013.01); H01L 29/0649 (2013.01); H01L 29/7883 (2013.01)

(58) Field of Classification Search
CPC .................. H01L 27/11521; H01L 27/11568; H01L 21/764
See application file for complete search history.

(56) References Cited

U.S. PATENT DOCUMENTS

| | | | |
|---|---|---|---|
| 7,338,896 B2 | 3/2008 | Vanhaelemeersch et al. | |
| 7,396,732 B2 | 7/2008 | Kunnen | |
| 7,400,024 B2 | 7/2008 | Kunnen | |
| 7,884,415 B2 * | 2/2011 | Nagano ............ | H01L 21/28273 257/314 |
| 8,435,877 B2 | 5/2013 | Yang et al. | |
| 8,575,680 B2 | 11/2013 | Shin et al. | |
| 8,629,035 B2 | 1/2014 | Nakazawa | |
| 8,975,684 B2 * | 3/2015 | Sim ..................... | H01L 29/0649 257/314 |
| 2006/0131655 A1 | 6/2006 | Kunnen | |
| 2006/0223301 A1 | 10/2006 | Vanhaelemeersch et al. | |
| 2006/0258077 A1 | 11/2006 | Kunnen | |
| 2009/0093100 A1 | 4/2009 | Xia et al. | |
| 2010/0230741 A1 * | 9/2010 | Choi ................. | H01L 21/76229 257/324 |
| 2012/0037975 A1 * | 2/2012 | Cho ..................... | H01L 21/764 257/321 |
| 2012/0132982 A1 * | 5/2012 | Lee .................... | H01L 21/28273 257/321 |
| 2012/0168899 A1 | 7/2012 | Kim et al. | |
| 2013/0181278 A1 | 7/2013 | Lee et al. | |
| 2013/0256781 A1 | 10/2013 | Paek et al. | |
| 2013/0256784 A1 | 10/2013 | Vellianitis et al. | |
| 2014/0061757 A1 * | 3/2014 | Kim .................. | H01L 29/42332 257/316 |

FOREIGN PATENT DOCUMENTS

| | | |
|---|---|---|
| JP | 4801356 | 10/2011 |
| KR | 100532727 | 11/2005 |
| KR | 2012031813 | 4/2012 |
| KR | 2013109289 | 10/2013 |

* cited by examiner

Primary Examiner — Allison P Bernstein
(74) Attorney, Agent, or Firm — Onello & Mello, LLP

(57) ABSTRACT

A memory device includes an array of floating gate memory cells. Adjacent memory cells are separated by a plurality of air gaps that electrically decouple respective active regions of adjacent memory cells from one another. Additionally, the air gaps electrically decouple an active region of a memory cell from a floating gate of an adjacent memory cell.

17 Claims, 32 Drawing Sheets

1200

1300

1400

MEMORY DEVICE AND METHOD OF FABRICATING THE SAME

This application claims priority from Korean Patent Application No. 10-2014-0075034 filed on Jun. 19, 2014 in the Korean Intellectual Property Office, the disclosure of which is incorporated herein by reference in its entirety.

BACKGROUND

1. Field of the Invention

Inventive concepts relate to a memory device and a method of fabricating the same.

2. Description of the Related Art

Progress in the electronics industry generally brings reduced size, increased functionality, and greater reliability. However, as more electronic devices, such as memory cells, are integrated in a smaller space, the potential for interference from neighboring devices increases. Therefore, research is being conducted on a technology that can reduce the disturbance among memory cells.

SUMMARY

In exemplary embodiments in accordance with principles of inventive concepts a memory device includes first and second active patterns that extend parallel to each other along a first direction; a tunnel insulating layer pattern and a floating gate pattern that are stacked sequentially on each of the first and second active patterns; an insulating layer pattern that fills a space between the first and second active patterns; a first liner pattern that is formed along side surfaces of the first and second active patterns and that has an etching selectivity with respect to the insulating layer pattern; a first air gap pattern that is formed on the first liner pattern to extend along the first direction; and a blocking insulating layer pattern and a control gate pattern that are stacked sequentially on the floating gate pattern and extend along a second direction intersecting the first direction.

In exemplary embodiments in accordance with principles of inventive concepts a memory device includes the insulating layer pattern comprises an oxide layer pattern, and the first liner pattern comprises a nitride layer pattern.

In exemplary embodiments in accordance with principles of inventive concepts a memory device includes an oxide layer pattern comprises a silicon oxide (SiO2) layer pattern and the nitride layer pattern comprises a silicon nitride (SiN) layer pattern.

In exemplary embodiments in accordance with principles of inventive concepts a memory device includes the first air gap pattern comprises a third air gap pattern that is formed on a first side of the first active pattern and a fourth air gap pattern that is formed on a second side of the second active pattern and is separated from the third air gap pattern by the insulating layer pattern.

In exemplary embodiments in accordance with principles of inventive concepts a memory device includes wherein a width of an upper part of the third air gap pattern in the first direction is greater than a width of a lower part of the third air gap pattern in the first direction.

In exemplary embodiments in accordance with principles of inventive concepts a memory device includes the lower part of the third air gap pattern and a lower part of the fourth air gap pattern are separated from each other by the insulating layer pattern, and the upper part of the third air gap pattern and an upper part of the fourth air gap pattern are formed as a single piece.

In exemplary embodiments in accordance with principles of inventive concepts a memory device includes third and fourth active patterns that extend parallel to each other along the first direction and have the insulating layer pattern formed therebetween; a fifth air gap pattern that extends along the first direction on a first side of the third active pattern; and a sixth air gap pattern that extends along the first direction on a second side of the fourth active pattern, wherein a lower part of the fifth air gap pattern and a lower part of the sixth air gap pattern are separated from each other by the insulating layer pattern, and an upper part of the fifth air gap pattern and an upper part of the sixth air gap pattern are formed as a single piece.

In exemplary embodiments in accordance with principles of inventive concepts a memory device includes a width of the upper part of the fourth air gap pattern is greater than a width of the lower part of the fourth air gap pattern.

In exemplary embodiments in accordance with principles of inventive concepts a memory device includes third and fourth active patterns that extend parallel to each other along the first direction and have the insulating layer pattern formed therebetween; a second liner pattern that is formed along side surfaces of the third and fourth active patterns and that has an etching selectivity with respect to the insulating layer pattern; and a second air gap pattern that is formed on the second liner pattern to extend along the first direction, wherein the first and second liner patterns are different from each other, and a size of the first and second air gap patterns are different from each other.

In exemplary embodiments in accordance with principles of inventive concepts a memory device includes a second liner pattern that is formed between the first and second active patterns and the first liner pattern and along the side surfaces of the first and second active patterns, wherein the first liner pattern and the second liner pattern comprise different materials.

In exemplary embodiments in accordance with principles of inventive concepts a memory device includes the first liner pattern comprises a nitride layer pattern, and the second liner pattern comprises an oxide layer pattern.

In exemplary embodiments in accordance with principles of inventive concepts a memory device includes an interlayer insulating film that covers top surfaces of the control gate patterns; and a second air gap pattern that extends along the second direction between the control gate pattern and another adjacent control gate pattern and intersects the first air gap pattern.

In exemplary embodiments in accordance with principles of inventive concepts a memory device includes first and second active patterns that extend parallel to each other along a first direction; a tunnel insulating layer pattern and a floating gate pattern that are stacked sequentially on each of the first and second active patterns; an insulating layer pattern that partially fills a space between the first and second active patterns; air gap patterns that extend along the first direction between the first and second active patterns and are separated from each other by the insulating layer pattern; and a blocking insulating layer pattern and a control gate pattern that are stacked sequentially on the floating gate pattern and extend along a second direction intersecting the first direction.

In exemplary embodiments in accordance with principles of inventive concepts a memory device includes a width of an upper part of each of the air gap patterns in the first direction is greater than a width of a lower part of each of the air gap patterns in the first direction.

In exemplary embodiments in accordance with principles of inventive concepts a memory device includes the lower parts of the air gap patterns are separated from each other by the insulating layer pattern, and the upper parts of the air gap patterns are not separated from each other by the insulating layer pattern.

In exemplary embodiments in accordance with principles of inventive concepts a memory device includes a liner pattern that is formed along side surfaces of the first and second active patterns and has an etching selectivity with respect to the insulating layer pattern, wherein the air gap patterns are formed on the liner pattern.

In exemplary embodiments in accordance with principles of inventive concepts a memory device includes the liner pattern is disposed on bottom surfaces of the air gap patterns, and the insulating layer pattern is disposed on respective side surfaces of the air gap patterns.

In exemplary embodiments in accordance with principles of inventive concepts a memory device includes an oxide layer pattern that is formed between the first and second active patterns and the liner pattern and along the side surfaces of the first and second active patterns, wherein the oxide layer pattern is disposed on the other respective side surfaces of the air gap patterns.

In exemplary embodiments in accordance with principles of inventive concepts a memory device includes a memory cell array that comprises a plurality of memory cells; a row decoder that selects a memory cell included in the memory cell array by selecting one of a plurality of word lines; a page buffer that is connected to a plurality of bit lines connected to the memory cell array and reads data stored in the selected memory cell through a bit line connected to the selected memory cell; an oxide layer pattern that extends along the bit lines and is disposed between the bit lines; a nitride layer pattern that extends along the bit lines and is disposed between the bit lines and the oxide layer pattern; and an air gap pattern that extends along the bit lines and is at least partially surrounded by the oxide layer pattern and the nitride layer pattern.

In exemplary embodiments in accordance with principles of inventive concepts a memory device includes wherein the memory cells form a NAND string within the memory cell array and comprising a NAND flash memory device.

In exemplary embodiments in accordance with principles of inventive concepts a method of fabricating a memory device includes providing an active pattern, a tunnel insulating layer pattern, and a floating gate pattern that extend along a first direction and are stacked sequentially; forming a liner layer along a side surface of the active pattern on at least one side of the active pattern; forming an insulating layer on the liner layer; partially etching the liner layer using etching selectivities of the insulating layer and the liner layer; and forming a first air gap pattern on the liner layer to extend along the first direction by forming a blocking insulating layer pattern and a control gate pattern that are stacked sequentially on the insulating layer and extend along a second direction intersecting the first direction.

In exemplary embodiments in accordance with principles of inventive concepts a method of fabricating a memory device includes wherein the partial etching of the liner layer comprises:

performing a first process of etching the liner layer and the insulating layer such that a top surface of the liner layer and a top surface of the insulating layer become lower than a top surface of the floating gate pattern; and performing a second process of etching the liner layer such that the top surface of the liner layer becomes lower than the top surface of the insulating layer.

In exemplary embodiments in accordance with principles of inventive concepts a method of fabricating a memory device includes wherein the performing of the second process of etching the liner layer comprises: performing a third process of etching the insulating layer such that the top surface of the insulating layer becomes lower than the top surface of the liner layer; and performing a fourth process of etching the liner layer such that the top surface of the liner layer becomes lower than the top surface of the insulating layer.

In exemplary embodiments in accordance with principles of inventive concepts a method of fabricating a memory device includes wherein the partial etching of the liner layer comprises isotropically etching part of the liner layer.

In exemplary embodiments in accordance with principles of inventive concepts a method of fabricating a memory device includes wherein the forming of the blocking insulating layer pattern and the control gate pattern comprises: sequentially forming a blocking insulating layer and a conductive layer on the insulating layer to extend along the second direction; partially exposing the top surface of the insulating layer by etching the blocking insulating layer and the conductive layer; and increasing a width of an upper part of the first air gap pattern by partially etching the exposed top surface of the insulating layer.

In exemplary embodiments in accordance with principles of inventive concepts a method of fabricating a memory device includes wherein the partial etching of the exposed top surface of the insulating layer comprises isotropically etching part of the exposed top surface of the insulating layer.

In exemplary embodiments in accordance with principles of inventive concepts a method of fabricating a memory device includes forming a second air gap pattern to extend along the second direction by forming an interlayer insulating film on the blocking insulating layer pattern and the control gate pattern.

In exemplary embodiments in accordance with principles of inventive concepts a method of fabricating a memory device includes forming an oxide layer along the side surface of the active pattern on at least one side of the active pattern before the forming of the liner layer, wherein the partially etching of the liner layer comprises partially etching the liner layer using an etching selectivity of the liner layer with respect to the insulating layer and the oxide layer.

In exemplary embodiments in accordance with principles of inventive concepts a method of fabricating a memory device includes wherein the oxide layer and the insulating layer comprise the same material.

In exemplary embodiments in accordance with principles of inventive concepts a method of fabricating a memory device includes wherein the providing of the active pattern, the tunnel insulating layer pattern, and the floating gate pattern comprises: sequentially stacking a tunnel insulating layer and a semiconductor material on a substrate; and forming the floating gate pattern, the tunnel insulating layer pattern, and the active pattern by partially etching the semiconductor material, the tunnel insulating layer, and the substrate.

In exemplary embodiments in accordance with principles of inventive concepts a memory device includes an array of floating gate memory cells, each including a tunnel insulating layer and a floating gate; and a plurality of air gaps formed between adjacent floating gate memory cells, each air gap horizontally separate from but vertically straddling the tunnel insulating layer.

In exemplary embodiments in accordance with principles of inventive concepts a memory device includes wherein each memory cell includes an active pattern upon which the tunnel insulating layer and floating gate are formed and wherein the active pattern of a memory cell is electrically decoupled from the active pattern of an adjacent memory cell by the plurality of air gaps formed therebetween.

In exemplary embodiments in accordance with principles of inventive concepts a memory device includes wherein active pattern of a memory cell is electrically decoupled from the floating gate of an adjacent memory cell by the plurality of air gaps formed therebetween.

In exemplary embodiments in accordance with principles of inventive concepts a method of fabricating a memory device includes forming an array of floating gate memory cells, each including a tunnel insulating layer and a floating gate; and forming a plurality of air gaps between adjacent floating gate memory cells, each air gap horizontally separate from but vertically straddling the tunnel insulating layer.

In exemplary embodiments in accordance with principles of inventive concepts a method of fabricating a memory device includes forming an active pattern and forming the tunnel insulating layer and floating gate thereupon to electrically decouple the active pattern of a memory cell from the active pattern of an adjacent memory cell by the plurality of air gaps formed therebetween.

In exemplary embodiments in accordance with principles of inventive concepts a method of fabricating a memory device includes wherein the plurality of air gaps are formed to electrically decouple an active pattern of a memory cell from the floating gate of an adjacent memory cell.

BRIEF DESCRIPTION OF THE DRAWINGS

The above and other aspects and features of inventive concepts will become more apparent by describing in detail exemplary embodiments thereof with reference to the attached drawings, in which.

DETAILED DESCRIPTION OF THE EMBODIMENTS

Figure 1:
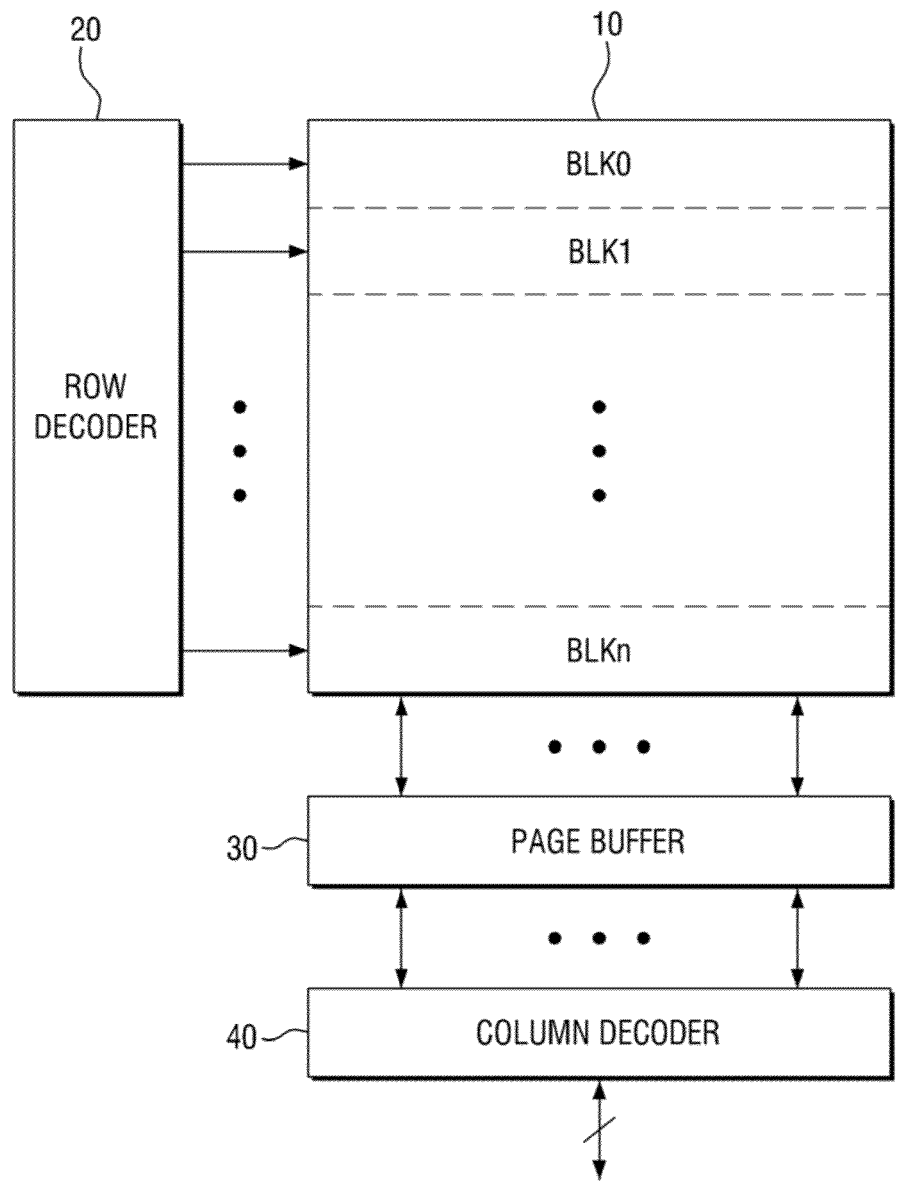
FIG. 1 is a block diagram of a memory device in accordance with principles of inventive concepts.

Various exemplary embodiments will be described more fully hereinafter with reference to the accompanying drawings, in which some exemplary embodiments are shown. Inventive concepts may, however, be embodied in many different forms and should not be construed as limited to the exemplary embodiments set forth herein. Rather, these exemplary embodiments are provided so that this description will be thorough and complete, and will convey the scope of inventive concepts to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items and the term "or" is meant to be inclusive, unless otherwise indicated.

It will be understood that, although the terms first, second, third, fourth etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts. The thickness of layers may be exaggerated for clarity.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of inventive concepts. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of idealized exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of inventive concepts.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
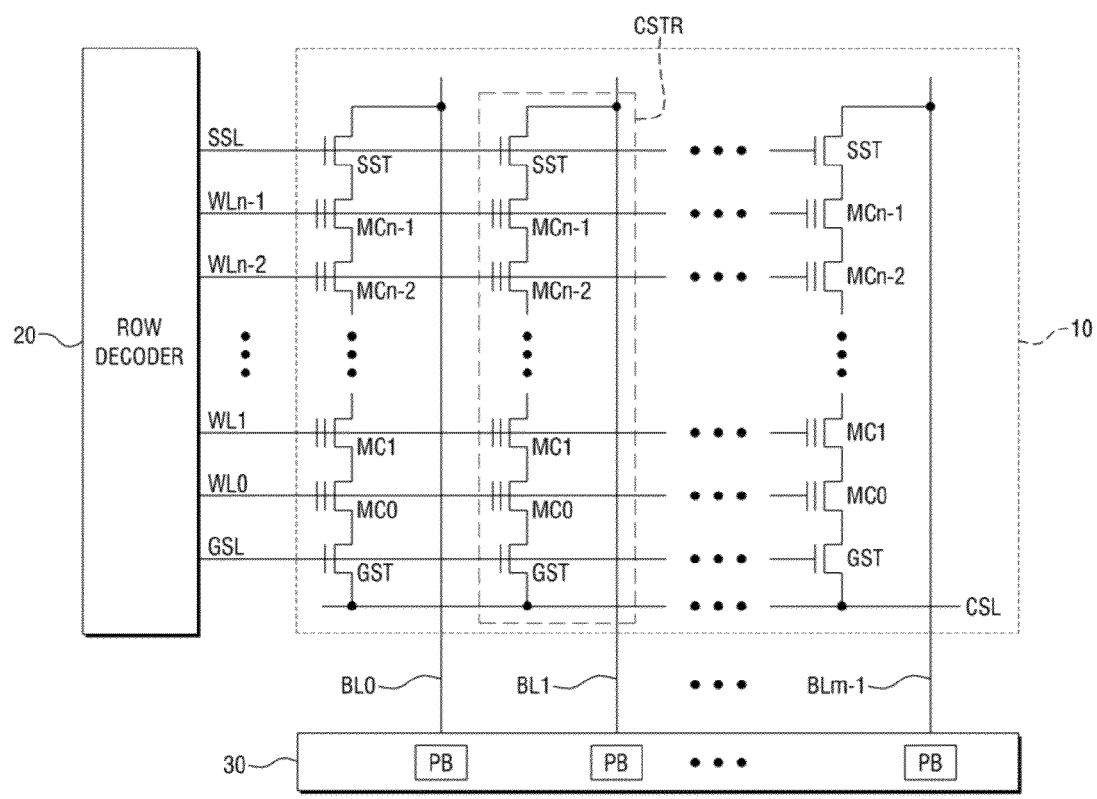
FIG. 2 is a circuit diagram of a memory cell array illustrated in FIG. 1.

FIG. 1 is a block diagram of an exemplary embodiment of a memory device in accordance with principles of inventive concepts. FIG. 2 is a circuit diagram of a memory cell array 10 illustrated in FIG. 1.

A NAND flash memory will hereinafter be described as an example of a memory device in accordance with principles of inventive concepts, but inventive concepts are not limited to a NAND flash memory.

Referring to FIGS. 1 and 2, the memory device includes the memory cell array 10, a row decoder 20, a page buffer 30, and a column decoder 40.

The memory cell array 10 may include a plurality of memory blocks BLK0 through BLKn. Each of the memory blocks BLK0 through BLKn may include a plurality of word lines, a plurality of bit lines, and a plurality of memory cells, for example. Each of the memory blocks BLK0 through BLKn may store data using the word lines, the bit lines, and the memory cells.

Specifically, referring to FIG. 2, the memory cell array 10 may include a plurality of cell strings CSTR connected to a plurality of bit lines BL0 through BLm−1. In exemplary embodiments, cell strings CSTR may form a NAND string, for example.

Each cell string CSTR that forms one column may include at least one string select transistor SST and at least one ground select transistor GST.

A plurality of memory cells MC0 through MCn−1 may be connected in series between the string select transistor SST and the ground select transistor GST. As illustrated in FIG. 1, the cell strings CSTR may be electrically connected to the bit lines BL0 through BLm−1, respectively.

The row decoder 20 may select one of the memory blocks BLK0 through BLKn of the memory cell array 10 according to address information and may select one of a plurality of word lines WL0 through WLn−1 which is connected to the selected memory block (for example, one of the memory blocks BLK0 through BLKn).

The row decoder 20 may provide a word line voltage generated by a voltage generation circuit (not illustrated) to a selected word line in response to a control circuit (not illustrated) and may provide a predetermined voltage to unselected word lines.

The page buffer 30 may temporarily store data that are to be stored in the memory cells MC0 through MCn−1 or detect data stored in the memory cells MC0 through MCn−1 according to an operation mode.

The page buffer 30 may operate as a write driver circuit in a program operation mode and may operate as a sense amplifier circuit in a read operation mode, for example.

In some exemplary embodiments, as illustrated, for example, in FIG. 2, the page buffer 30 may include a plurality of buffers PB which are respectively connected to the bit lines BL0 through BLm−1 or groups of bit lines.

The column decoder 40 may provide a data transmission path between the page buffer 30 and an external device (for example, a memory controller).

In the memory device, the memory cell array 10 may perform read and program operations on a page-by-page basis and perform an erase operation on a memory block-by-memory block basis.

More specifically, in a program operation of storing data in a selected memory cell, the memory device may apply a program voltage VPGM to a selected word line and apply a pass voltage VPASS to unselected word lines.

In exemplary embodiments, the program voltage VPGM may be a high voltage, one of approximately 10 to 20 V, for example, and the pass voltage VPASS may be a lower voltage that can nevertheless turn on a transistor of a memory cell.

In the program operation, 0 V may be applied to a selected bit line, and a power supply voltage may be applied to unselected bit lines. In addition, a ground voltage may be applied to a ground select line GSL that gates the ground select transistor GST, and a power supply voltage may be applied to a string select line SSL that gates the string select transistor SST.

In exemplary embodiments, a voltage of approximately 1.5 to 2.0 V may be applied to a common source line CSL, and a ground voltage may be applied to a semiconductor substrate.

Under the above voltage conditions, a selected string select transistor SST and respective transistors of the memory cells MC0 through MCn−1 included in a selected cell string CSTR may be turned on. Therefore, channels of the transistors of the memory cells MC0 through MCn−1 included in the selected cell string CSTR may have the same electric potential (for example, with a potential difference of 0 V) as a selected bit line. In exemplary embodiments, if a high program voltage VPGM is applied to a selected word line, an F-N tunneling phenomenon may occur in the transistor of a selected memory cell. Accordingly, data can be written to the selected memory cell.

In an erase operation performed on a memory block-by-memory block basis by the memory device, a ground voltage (for example, 0 V) may be provided to the word lines WL0 through WLn−1, and an erase voltage (for example, approximately 18 to 20 V) may be applied to the semiconductor substrate including the memory cells MC0 through MCn−1. In exemplary embodiments, the string select line SSL, the ground select line GSL, and the common source line CSL may be floating. Accordingly, electric charges stored in the transistors of the memory cells MC0 through MCn−1 (more specifically, electric charges stored in floating gates) may be discharged to the semiconductor substrate.

Figure 3:
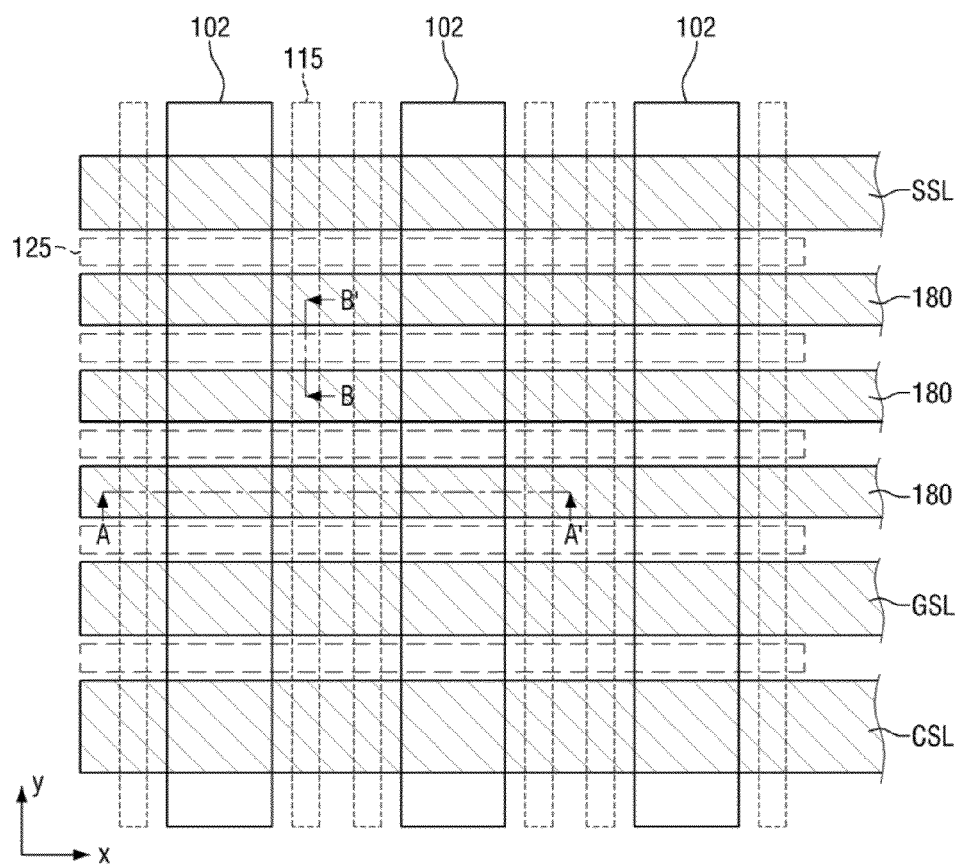
FIG. 3 is a layout diagram of the memory cell array of FIG. 1.
Figure 4A:
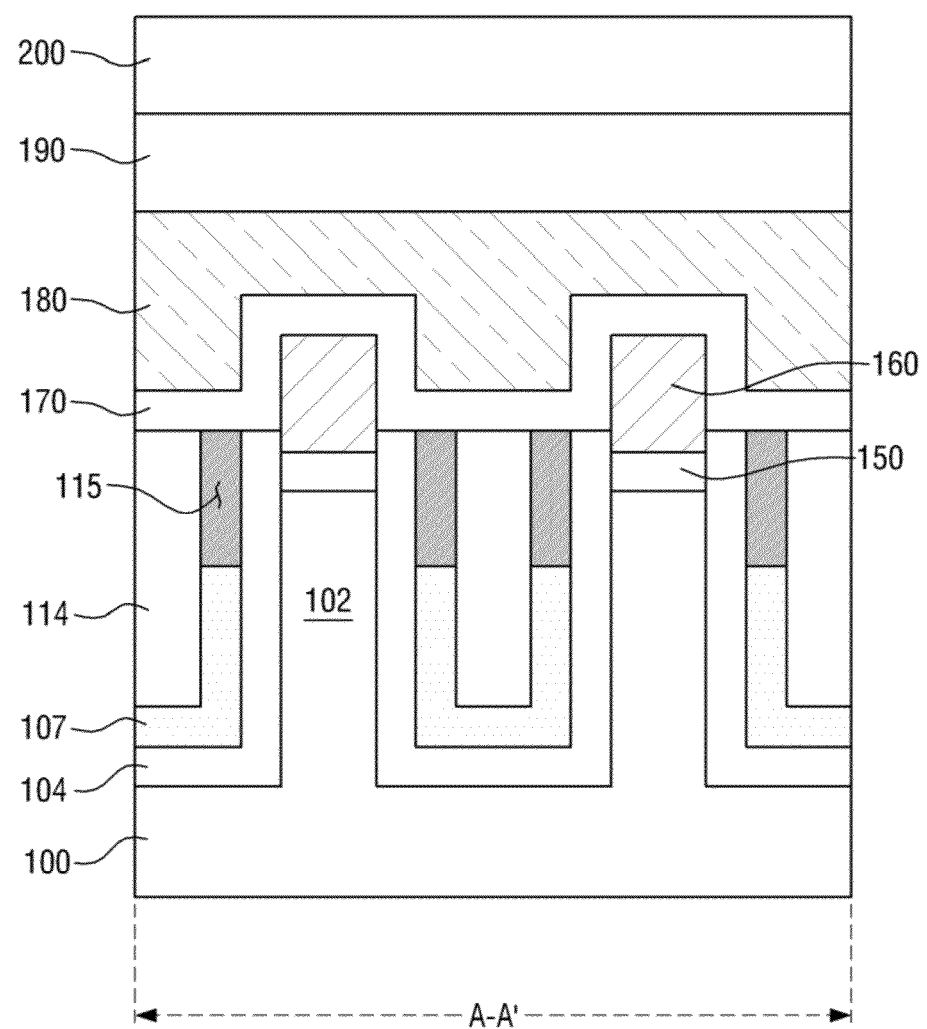
FIG. 4A is a cross-sectional view of a memory device in accordance with principles of inventive concepts, taken along the line A-A' of FIG. 3.
Figure 4B:
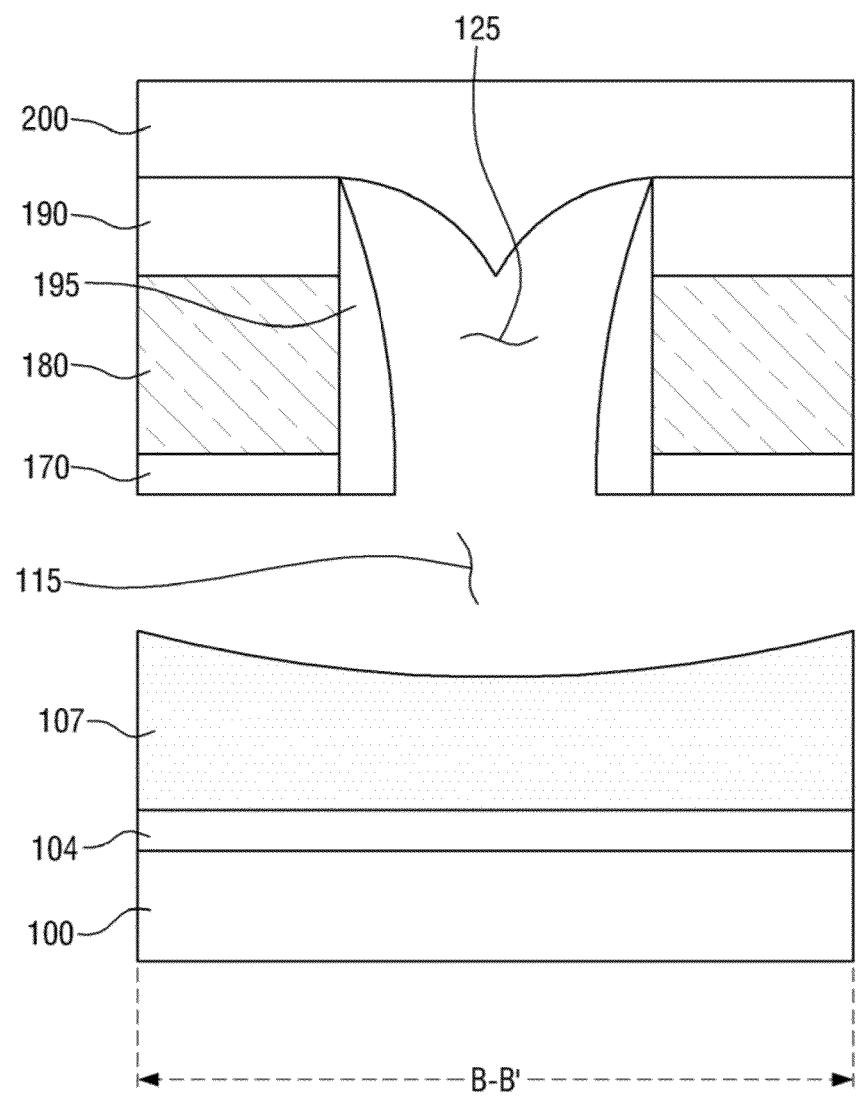
FIG. 4B is a cross-sectional view of the memory device according to the embodiment of FIG. 4A, taken along the line B-B' of FIG. 3.

FIG. 3 is a layout diagram of the memory cell array 10 of FIG. 1. FIG. 4A is a cross-sectional view of a memory device in accordance with principles of inventive concepts, taken along the line A-A' of FIG. 3. FIG. 4B is a cross-sectional view of the memory device according to the embodiment of FIG. 4A, taken along the line B-B' of FIG. 3.

Referring to FIGS. 3 through 4B, active patterns 102 may be formed on a substrate 100 to extend parallel to each other along a first direction (for example, a y direction). As illustrated in FIGS. 3 through 4B, the active patterns 102 may protrude upward from a top surface of the substrate 100.

In exemplary embodiments in accordance with principles of inventive concepts, the active patterns 102 may function as the bit lines BL0 through BLm−1 (see FIG. 2) described above.

In exemplary embodiments in accordance with principles of inventive concepts, the substrate 100 and the active patterns 102 may be bulk silicon or silicon-on-insulator (SOI). Alternatively, the substrate 100 and the active patterns 102 may be a silicon substrate or may include another material such as silicon germanium, indium antimonide, lead telluride, indium arsenide, indium phosphide, gallium arsenide, or gallium antimonide.

In other exemplary embodiments, the substrate 100 and the active patterns 102 may be a base substrate and an epitaxial layer formed on the base substrate. In such exemplary embodiments, the epitaxial layer may include silicon or germanium which is an element semiconductor material.

In exemplary embodiments in accordance with principles of inventive concepts, substrate 100 and the active patterns 102 may also include a compound semiconductor such as a group IV-IV compound semiconductor or a group III-V compound semiconductor. Specifically, the group IV-IV compound semiconductor that forms the epitaxial layer may be a binary or ternary compound containing two or more of carbon (C), silicon (Si), germanium (Ge) and tin (Sn) or a compound obtained by doping the binary or ternary compound with a group IV element.

The group III-V compound semiconductor that forms the epitaxial layer may be a binary, ternary, or quaternary compound composed of at least one of aluminum (Al), gallium (Ga) and indium (In) (i.e., group III elements) bonded with one of phosphorus (P), arsenic (As) and antimony (Sb) (i.e., group V elements).

In a memory device according to the current embodiment, a case where the substrate 100 and the active patterns 102 include silicon will be described as an example, but inventive concepts are not limited to such a case.

Tunnel insulating layer patterns 150 and floating gate patterns 160 may be stacked sequentially on the active patterns 102, respectively.

The tunnel insulating layer patterns 150 may be disposed in an isolated manner on the active patterns 102 of the substrate 100. The tunnel insulating layer patterns 150 may extend along the first direction y.

Each of the tunnel insulating layer patterns 150 may include an oxide layer pattern (for example, a silicon oxide (SiO2) layer pattern) or an oxynitride layer pattern (for example, a silicon oxynitride (SiON) layer pattern).

Specifically, the tunnel insulating layer patterns 150 may include, for example, oxides formed by an oxidation process performed on the active patterns 102 or oxynitrides formed by an oxynitridation process performed on the active patterns 102.

The floating gate patterns 160 may be formed in an isolated manner on the tunnel insulating layer patterns 150, respectively, and may extend along the first direction y.

The floating gate patterns 160 may include a semiconductor material. For example, the floating gate patterns 160 may include polycrystalline silicon (poly-Si).

Each of the floating gate patterns 160 may function as a data repository. That is, each of the floating gate patterns 160 may perform a data storing function by storing electric charges in the form of free charges.

In exemplary embodiments in accordance with principles of inventive concepts, the floating gate patterns 160 may be un-doped. However, inventive concepts are not limited thereto and in other exemplary embodiments floating gate patterns 160 may be doped. For example, if the active patterns 102 are doped with first-type dopants, the floating gate patterns 160 may be doped with second-type dopants different from the first-type dopants. In such exemplary embodiments, any one of the first-type dopants and the second-type dopants may be n-type dopants, and the other one may be p-type dopants.

Otherwise, the active patterns 102 and the floating gate patterns 160 may be doped with dopants of the same type. For example, if the active patterns 102 and the floating gate patterns 160 are doped with dopants of the same type, electric charges of major carriers stored in the floating gate patterns 160 may be of an opposite type to the type of the dopants used to dope the active patterns 102 and the floating gate patterns 160. In such exemplary embodiments, an energy barrier between the electric charges stored in the floating gate patterns 160 and the tunnel insulating layer patterns 150 may increase, thereby improving data retaining characteristics of memory cells.

A first liner pattern 104 may be formed along side surfaces of each of the active patterns 102. The first liner pattern 104 may be conformally formed along the side surfaces of each of the active patterns 102 and the top surface of the substrate 100. The first liner patterns 104 may extend parallel to the active patterns 102 along the first direction y.

In some exemplary embodiments in accordance with principles of inventive concepts, top surfaces of the first liner patterns 104 may be higher than top surfaces of the tunnel insulating layer patterns 150 and lower than top surfaces of the floating gate patterns 160. That is, upper parts of the first liner patterns 104 may overlap the floating gate patterns 160.

In exemplary embodiments in accordance with principles of inventive concepts, each of the first liner patterns 104 may include an oxide layer pattern. For example, each of the first liner patterns 104 may include a SiO2 layer pattern.

In exemplary embodiments in accordance with principles of inventive concepts the first liner patterns 104 may be omitted, in which case a second liner pattern 107 may contact the side surfaces of each of the active patterns 102 and may be conformally formed along the side surfaces of each of the active patterns 102 and the top surface of the substrate 100.

The second liner patterns 107 may be formed on the first liner patterns 104, respectively. The second liner patterns 107 may also be conformally formed along the side surfaces of the active patterns 102 and the top surface of the substrate 100, as illustrated in the figures. The second liner patterns 107 may extend parallel to the active patterns 102 along the first direction y.

In exemplary embodiments in accordance with principles of inventive concepts, top surfaces of the second liner patterns 107 may be lower than top surfaces of the active patterns 102. Accordingly, first air gap patterns 115 formed on the second liner patterns 107 may overlap the active patterns 102.

Referring to FIG. 4B, the top surface of each of the second liner patterns 107 may have different heights along the first direction y. In exemplary embodiments in accordance with principles of inventive concepts, the top surface of each of the second liner patterns 107 has different heights along the first direction y because an upper part of each of the second liner patterns 107 has been etched isotropically. This will be described in more detail later when methods of fabricating a memory device in accordance with principles of inventive concepts are described.

In exemplary embodiments in accordance with principles of inventive concepts, the second liner patterns 107 may include a material having an etching selectivity with respect to insulating layer patterns 114. In addition, in exemplary embodiments in accordance with principles of inventive concepts, the second liner patterns 107 may include a material having an etching selectivity with respect to the first liner patterns 104.

For example, the first liner patterns 104 and the insulating layer patterns 114 may be made of oxide layer patterns, and the second liner patterns 107 may be made of nitride layer patterns. For example, the first liner patterns 104 and the insulating layer patterns 114 may be made of SiO2 layer patterns and the second liner patterns 107 may be made of SiN layer patterns.

Each of the insulating layer patterns 114 may be formed between the active patterns 102. In exemplary embodiments in accordance with principles of inventive concepts, each of the insulating layer patterns 114 may be formed inside a U-shaped second liner pattern 107 disposed between the active patterns 102.

Each of the insulating layer patterns 114 may be a gap-fill insulating layer pattern that fills a space between the active patterns 102.

In exemplary embodiments in accordance with principles of inventive concepts, top surfaces of the insulating layer patterns 114 may be higher than the top surfaces of the tunnel insulating layer patterns 150 and lower than the top surfaces of the floating gate patterns 160. In other words, upper parts of the insulating layer patterns 114 may overlap the floating gate patterns 160.

In exemplary embodiments in accordance with principles of inventive concepts, each of the insulating layer patterns 114 may include an oxide layer pattern such as a SiO2 layer pattern. In exemplary embodiments in accordance with principles of inventive concepts, each of the insulating layer patterns 114 may include TOnen SilaZene (TOSZ) oxide layer pattern.

The first air gap patterns 115 may be formed on the second liner patterns 107 to extend along the first direction y.

As illustrated in the figures, a bottom surface of each of the first air gap patterns 115 may be covered by a second liner pattern 107, and a side surface of each of the first air gap patterns 115 may be covered by an insulating layer pattern 114.

In exemplary embodiments in accordance with principles of inventive concepts, the other side surface of each of the first air gap patterns 115 may be covered by a first liner pattern 104, and a top surface of each of the first air gap patterns 115 may be covered by a blocking insulating layer pattern 170.

The first air gap patterns 115 may overlap the active patterns 102. That is, the bottom surfaces of the first air gap patterns 115 may be lower than the top surfaces of the active patterns 102.

In addition, the first air gap patterns 115 may overlap the floating gate patterns 160. That is, the top surfaces of the first air gap patterns 115 may be higher than bottom surfaces of the floating gate patterns 106.

As illustrated, for example, in FIG. 4B, each of the first air gap patterns 115 may have different heights along the first direction y. In exemplary embodiments in accordance with principles of inventive concepts each of the first air gap patterns 115 has different heights along the first direction y because the upper part of each of the second liner patterns 107 has been etched isotropically. This will also be described in more detail later when methods of fabricating a memory device in accordance with principles of inventive concepts are described.

In exemplary embodiments in accordance with principles of inventive concepts, two first air gap patterns 115 may be disposed between adjacent active patterns 102. In such exemplary embodiments, the two first air gap patterns 115 may be separated from each other in a second direction (for example, an x direction) by an insulating layer pattern 114.

The blocking insulating layer patterns 170 may be formed on the floating gate patterns 160 to extend along the second direction x. The blocking insulating layer patterns 170 may partially cover the top surfaces of the first air gap patterns 115, as illustrated in the figures.

Each of the blocking insulating layer patterns 170 may include, for example, an oxide/nitride/oxide (ONO) layer. However, embodiments in accordance with principles of inventive concepts are not limited thereto, and the blocking insulating layer patterns 170 may also include a high dielectric material (for example, an insulating metal oxide such as aluminum oxide (Al2O3), hafnium oxide (HfO), etc.) having a higher dielectric constant than the tunnel insulating layer patterns 150.

In exemplary embodiments in accordance with principles of inventive concepts, the blocking insulating layer patterns 170 may include a high dielectric material and a barrier dielectric material. In such exemplary embodiments, the barrier dielectric material may include a dielectric material (for example, SiO2) having a greater energy bandgap than a high dielectric material.

Control gate patterns 180 may respectively be formed on the blocking insulating layer patterns 170 to extend along the second direction x.

Although not specifically illustrated in the drawings, each of the control gate patterns 180 may include a control base gate and a control metal pattern stacked sequentially.

The control base gate may include a conductive material (for example, a doped semiconductor such as doped silicon, doped silicon-germanium, etc.) having an etching selectivity with respect to the control metal pattern. However, embodiments in accordance with principles of inventive concepts are not limited thereto, and the control base gate may also include another conductive material having an etching selectivity with respect to the gate metal pattern, for example.

In exemplary embodiments in accordance with principles of inventive concepts, the control base gate may include conductive metal nitride (TiN, TaN, etc.) or transition metal (such as Ti, Ta, etc.). In other exemplary embodiments the control base gate may include doped semiconductor and conductive metal nitride.

The control metal pattern may include a metal with low resistivity, such as tungsten (W) or copper (Cu).

In exemplary embodiments in accordance with principles of inventive concepts, the control gate patterns 180 may function as the word lines WL0 through WLn−1 (see FIG. 2) described above.

Capping layer patterns 190 may respectively be formed on the control gate patterns 180 to extend along the second direction x.

Each of the capping layer patterns 190 may include a silicon oxide layer, a silicon nitride layer, or a silicon oxynitride layer.

Spacers 195 may be formed on sidewalls of the blocking insulating layer patterns 170, sidewalls of the control gate patterns 180, and sidewalls of the capping layer patterns 190. As illustrated, for example, in FIG. 4B, at least part of a space between adjacent blocking insulating layer patterns 170, between adjacent control gate patterns 180 and between adjacent capping layer patterns 190 may be filled with the spacers 195.

In exemplary embodiments in accordance with principles of inventive concepts, the spacers 195 may include a silicon oxide layer such as a high-density plasma (HDP) oxide layer. In other embodiments in accordance with principles of inventive concepts, the spacers 195 may include a silicon nitride layer.

The spacers 195 may include a material having an etching selectivity with respect to the insulating layer patterns 114. Accordingly, the spacers 195 may prevent the blocking insulating layer patterns 170, the control gate patterns 180, and the capping layer patterns 190 from being damaged in the process of forming second air gap patterns 125.

Each of the second air gap patterns 125 may extend along the second direction x between adjacent blocking insulating layer patterns 170, between adjacent control gate patterns 180 and between adjacent capping layer patterns 190. The second air gap patterns 125 may be formed on the first air gap patterns 115.

As illustrated in FIG. 3, the first air gap patterns 115 may intersect each of the second air gap patterns 125 between adjacent control gate patterns 180. In addition, the first air gap patterns 115 may intersect the second air gap patterns 125 between adjacent active patterns 102.

The second air gap patterns 125 may overlap the control gate patterns 180. Accordingly, each of the second air gap patterns 125 may reduce disturbances, or interference, between adjacent control gate patterns 180.

An interlayer insulating film 200 may be formed on the second air gap patterns 125. In other words, top surfaces of the second air gap patterns 125 may be covered by the interlayer insulating film 200.

The interlayer insulating film 200 may include, for example, an oxide layer. In exemplary embodiments the interlayer insulating film 200 may be, for example, a TetraEthOxySilane (TEOS) layer.

Referring to FIGS. 2 and 3, memory cells MC0 through MCn−1 may be defined in areas where the active patterns 120 functioning as the bit lines BL0 through BLm−1 and extending along the first direction y intersect the control gate patterns 180 functioning as the word lines WL0 through WLn−1 and extending along the second direction x.

A string select line SSL may extend along the second direction x on a first side of the control gate patterns 180 extending along the second direction x. In addition, string select transistors SST may be defined in areas where the active patterns 120 extending along the first direction y intersect the string select line SSL extending along the second direction x.

The string select transistors SST may be structured in a way similar to the memory cells MC0 through MCn−1 described above, and a detailed description thereof will not be repeated here.

A ground select line GSL may extend along the second direction x on a second side of the control gate patterns 180 extending along the second direction x. In addition, ground select transistors GST may be defined in areas where the active patterns 120 extending along the first direction y intersect the ground select line GSL extending along the second direction x.

The ground select transistors GST may also be structured in a way similar to the memory cells MC0 through MCn−1 described above, and thus a detailed description thereof will not be repeated here.

A common source line CSL may extend along the second direction x on a second side of the ground select line GSL extending along the second direction x. In exemplary embodiments in accordance with principles of inventive concepts, the common source line CSL may provide a predetermined voltage to the active patterns 102 according to the operation mode of the memory device.

In a memory device according to exemplary embodiments, the first air gap patterns 115 overlap the active patterns 102 in the first direction y. Accordingly, the first air gap patterns 115 may reduce the coupling between active patterns 102 and adjacent floating gate patterns 160. In addition, the first air gap patterns 115 may reduce the coupling between adjacent active patterns 102.

The reduced coupling between active patterns 102 and adjacent floating gate patterns 160 or the reduced coupling between adjacent active patterns 102 may reduce the disturbance among adjacent memory cells defined in areas where the control gate patterns 180 intersect the active patterns 102. Accordingly, the reliability of memory devices in accordance with principles of inventive concepts may be improved.

Figure 5A:
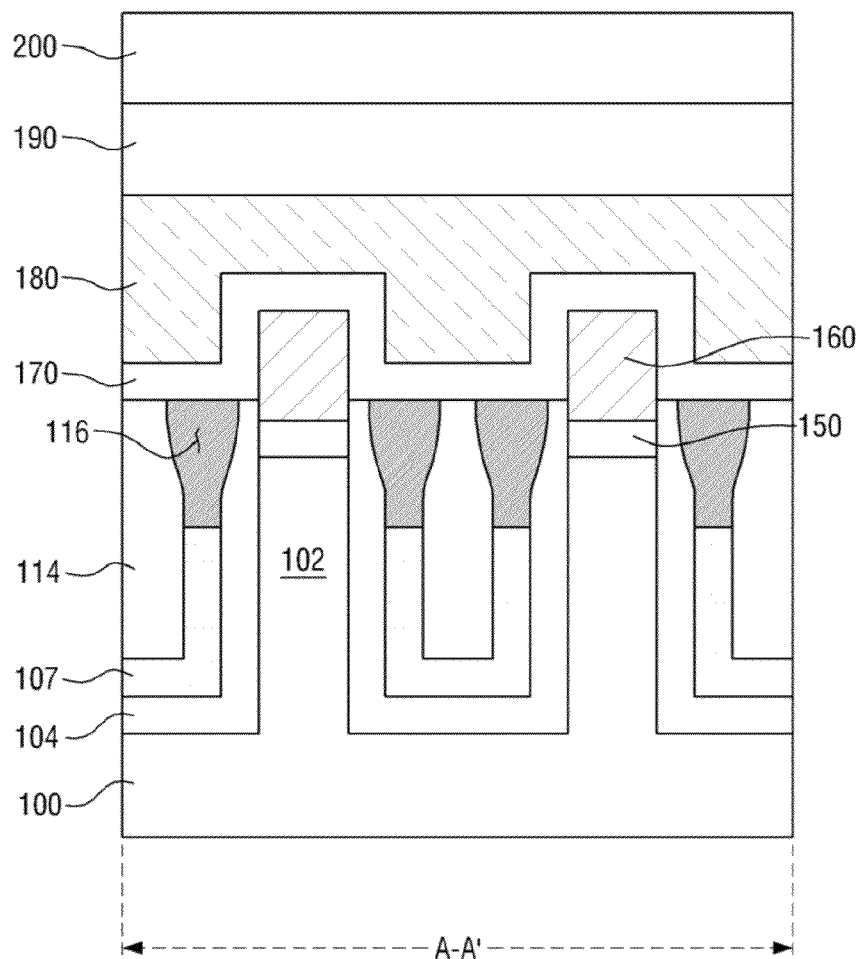
FIG. 5A is a cross-sectional view of a memory device according to another embodiment of the present invention, taken along the line A-A' of FIG. 3.
Figure 5B:
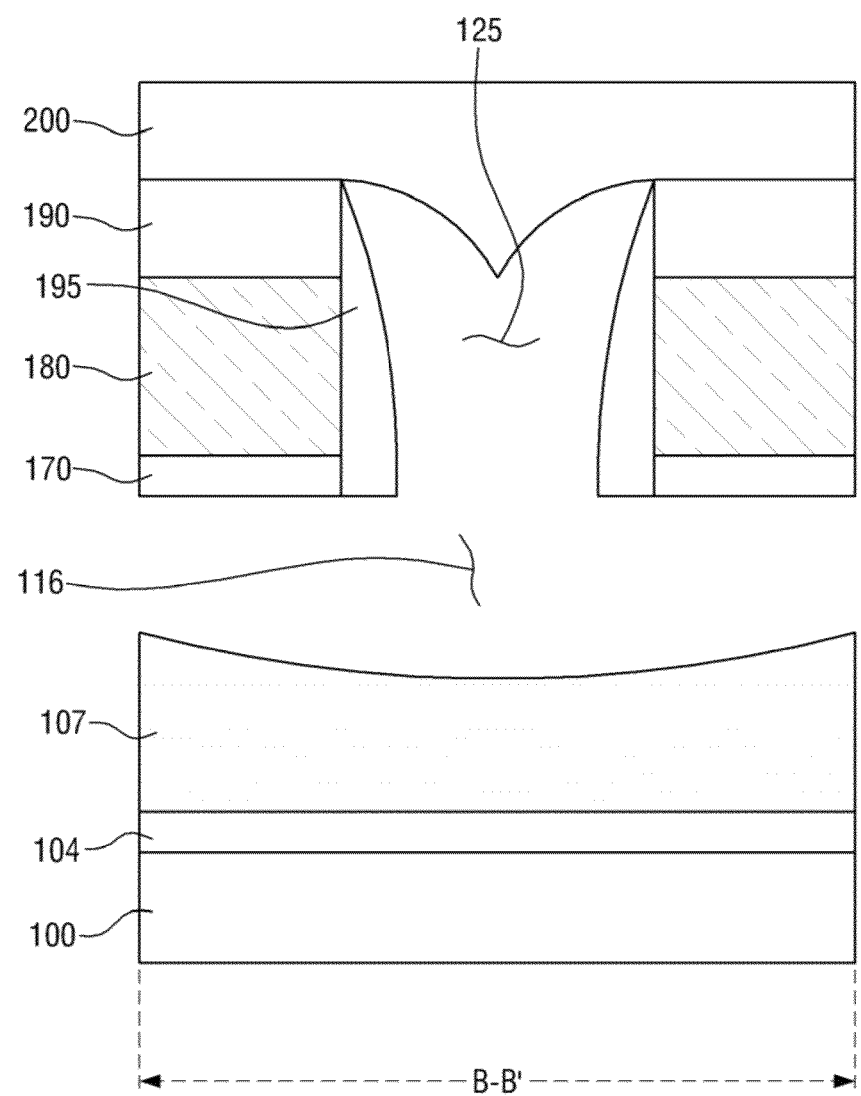
FIG. 5B is a cross-sectional view of the memory device according to the embodiment of FIG. 5A, taken along the line B-B' of FIG. 3.

FIG. 5A is a cross-sectional view of a memory device according to another exemplary embodiment in accordance with principles of inventive concepts, taken along the line A-A' of FIG. 3. FIG. 5B is a cross-sectional view of the memory device according to the embodiment of FIG. 5A, taken along the line B-B' of FIG. 3. The current exemplary embodiment will hereinafter be described, focusing mainly on differences from the above-described embodiment.

Referring to FIGS. 5A and 5B, upper and lower parts of each of first air gap patterns 116 of the memory device according to the current exemplary embodiment may have different widths.

In particular, in this exemplary embodiment a width of the upper part of each of the first air gap patterns 116 in a first direction y may be greater than a width of the lower part of each of the first air gap patterns 116 in the first direction y.

The first air gap patterns 116 of the memory device according to the current embodiment are shaped as described above because the upper parts of the first air gap patterns 115 (see FIG. 4A) according to the above-described embodiment have been additionally etched. This process will be described in greater detail later.

Figure 6A:
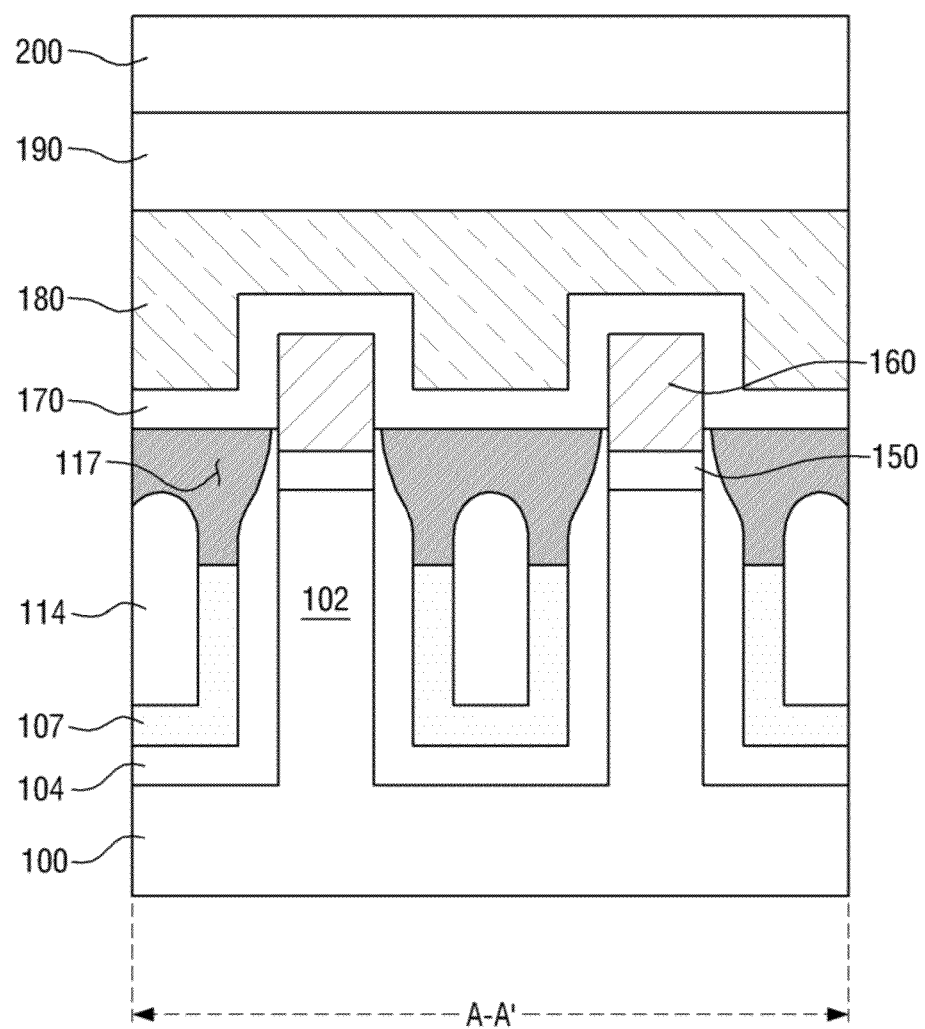
FIG. 6A is a cross-sectional view of a memory device according to another embodiment of the present invention, taken along the line A-A' of FIG. 3.
Figure 6B:
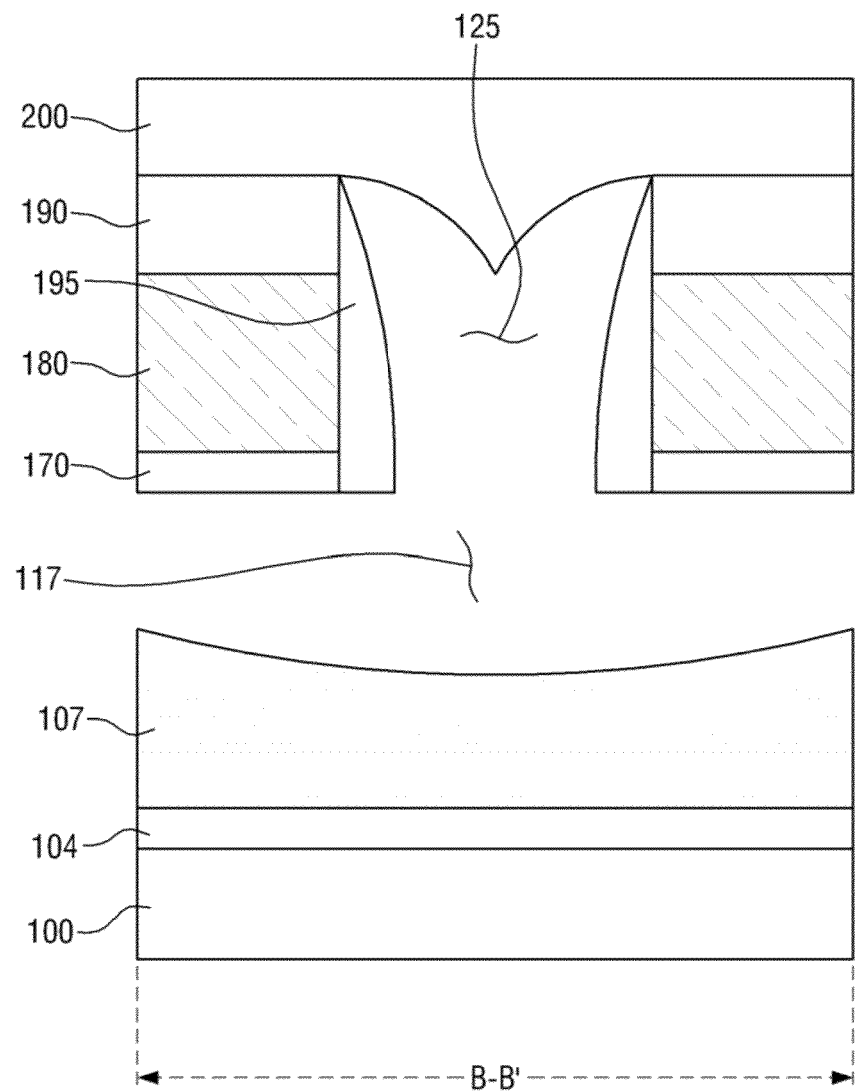
FIG. 6B is a cross-sectional view of the memory device according to the embodiment of FIG. 6A, taken along the line B-B' of FIG. 3.

FIG. 6A is a cross-sectional view of a memory device according to another exemplary embodiment in accordance with principles of inventive concepts, taken along the line A-A' of FIG. 1 FIG. 6B is a cross-sectional view of the memory device according to the embodiment of FIG. 6A, taken along the line B-B' of FIG. 3. The current embodiment will hereinafter be described, focusing mainly on differences between this and the above-described embodiments.

Referring to FIGS. 6A and 6B, upper and lower parts of each of first air gap patterns 117 of the memory device according to the current exemplary embodiment may have different widths.

In particular, in this exemplary embodiment a width of the upper part of each of the first air gap patterns 117 in a first direction y may be greater than a width of the lower part of each of the first air gap patterns 117 in the first direction y.

In the current exemplary embodiment, the lower part of each of the first air gap patterns 117 may be separated by an insulating layer pattern 114, whereas the upper part of each of the first air gap patterns 117 is formed as a single piece.

The first air gap patterns 117 of the memory device according to the current exemplary embodiment are shaped as described above because the upper parts of the first air gap patterns 116 (see FIG. 5A) according to the above-described embodiment have been additionally etched. This process will be described in greater detail later.

Figure 7:
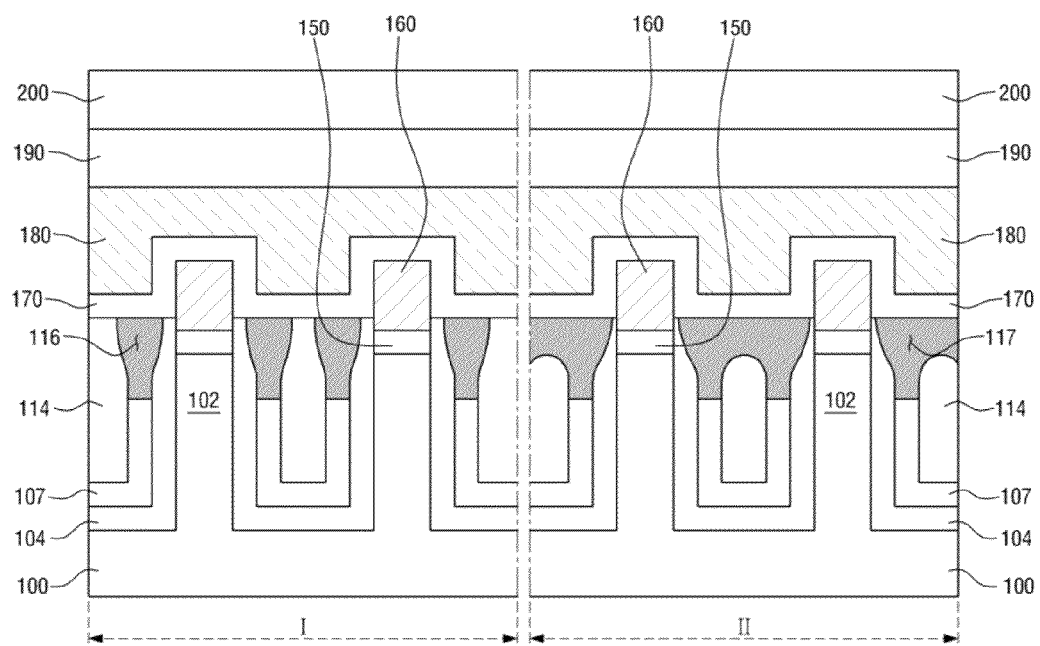
FIG. 7 is a cross-sectional view of a memory device according to another embodiment of the present invention.

FIG. 7 is a cross-sectional view of a memory device according to another exemplary embodiment in accordance with principles of inventive concepts. The current exemplary embodiment will hereinafter be described, focusing mainly on differences between this and the above-described embodiments.

Referring to FIG. 7, the memory device according to the current exemplary embodiment may include a first area I and a second area II.

In exemplary embodiments in accordance with principles of inventive concepts, the first area I may be an area of a memory cell array 10 (see FIG. 2), and the second area II may be the other area of the memory cell array 10 (see FIG. 2).

In exemplary embodiments in accordance with principles of inventive concepts, first air gap patterns 116 formed in the first area I may have a different shape from first air gap patterns 117 formed in the second area II.

In particular, in exemplary embodiments upper parts of both the first and second air gap patterns 116 and 117 are wider than lower parts thereof in a first direction y. However, while the upper and lower parts of each of the first air gap patterns 116 formed in the first area I are completely separated by an insulating layer pattern 114, only the lower part of each of the first air gap patterns 117 formed in the second area II is separated by an insulating layer pattern 114.

In exemplary embodiments in accordance with principles of inventive concepts, the first air gap patterns 116 formed in the first area I and the first air gap patterns 117 formed in the second area II have different shapes because the insulating layer patterns 114 have been etched to different degrees according to a process variation in the process of etching the insulating layer patterns 114.

Figure 8:
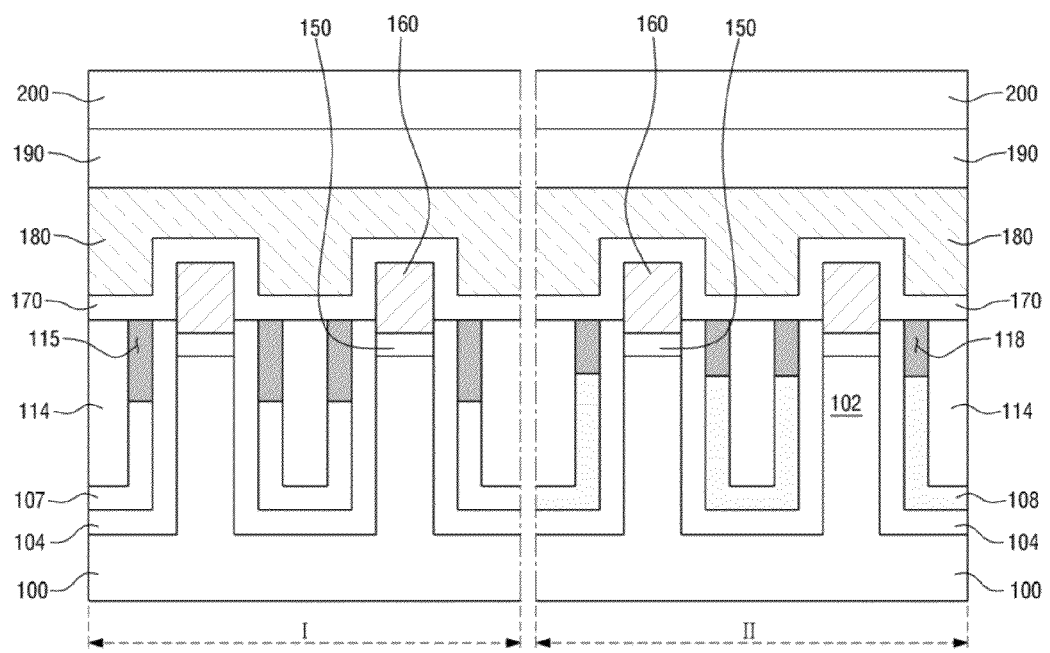
FIG. 8 is a cross-sectional view of a memory device according to another embodiment of the present invention.

FIG. 8 is a cross-sectional view of a memory device according to another exemplary embodiment in accordance with principles of inventive concepts. The current embodiment will hereinafter be described, focusing mainly on differences between this and the above-described embodiments.

Referring to FIG. 8, a first area I and a second area II of the memory device according to the current embodiment may include different second liner patterns 107 and 108.

The first area I may be an area of a memory cell array 10 (see FIG. 2), and the second area II may be the other area of the memory cell array 10 (see FIG. 2).

Because the second liner patterns 107 formed in the first area I are different from the second liner patterns 108 formed in the second area II, the second liner patterns 107 and 108 may have different etching selectivities with respect to insulating layer patterns 114 in the first area I and the second area II.

Accordingly, in exemplary embodiments in accordance with principles of inventive concepts first air gap patterns 115 formed in the first area I by etching the second liner patterns 107 may be different in size from first air gap patterns 118 formed in the second area II by etching the second liner patterns 108.

FIGS. 9A through 16B are views illustrating steps of a method of fabricating a memory device in accordance with principles of inventive concepts. Specifically, FIGS. 9A through 16A are cross-sectional views taken along the line A-A' of FIG. 3, and FIGS. 9B through 16B are cross-sectional views taken along the line B-B' of FIG. 3.

Figure 9A:
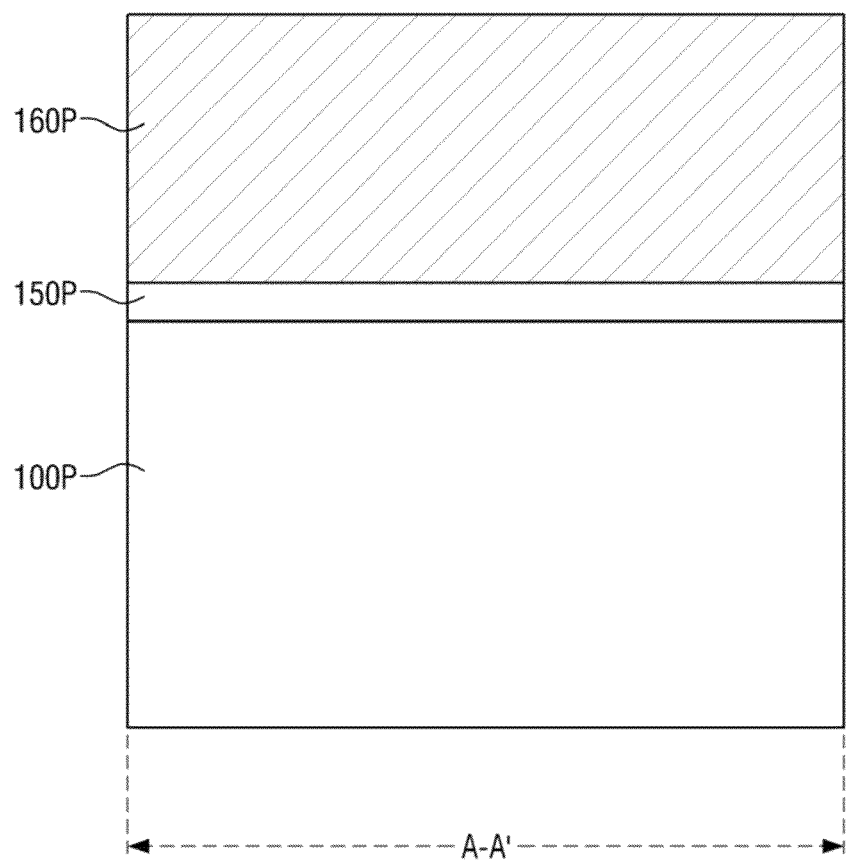
FIGS. 9A through 16B are views illustrating steps of a method of fabricating a memory device in accordance with principles of inventive concepts.
Figure 9B:
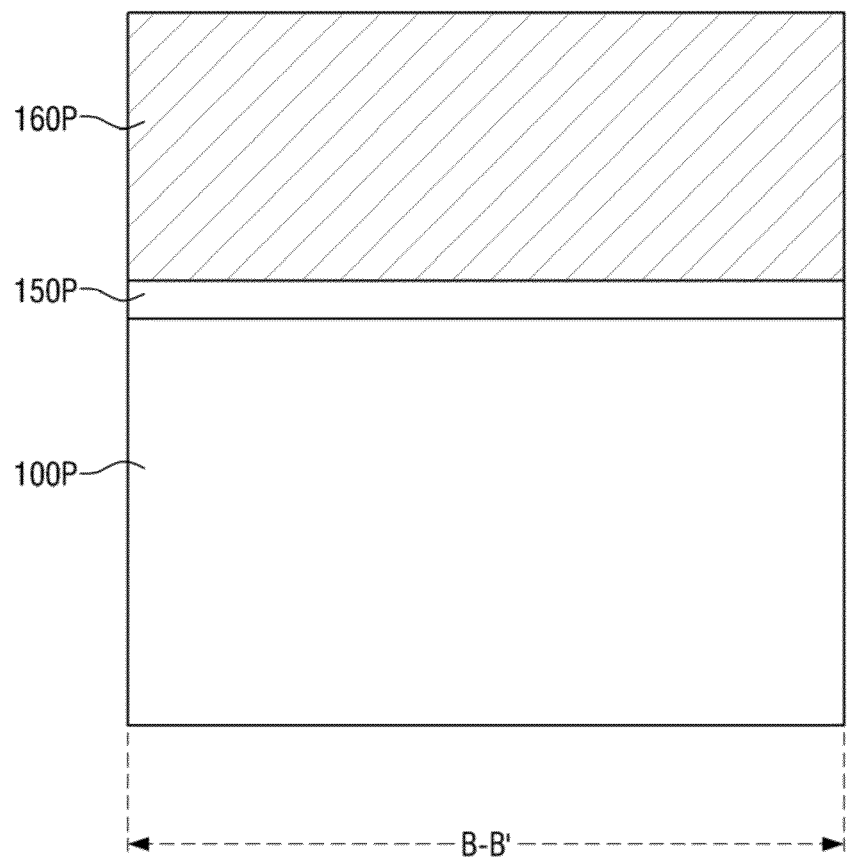

Referring to FIGS. 9A and 9B, in exemplary embodiments in accordance with principles of inventive concepts a tunnel insulating layer 150P and a semiconductor material 160P are stacked sequentially on a pre-substrate 100P.

The tunnel insulating layer 150P may include an oxide layer (for example, a SiO2 layer) or an oxynitride layer (for example, a SiON layer). The tunnel insulating layer 150P may be formed by performing an oxidation process on the pre-substrate 100P or an oxynitridation process on the pre-substrate 100P, for example.

The semiconductor material 160P may include, for example, poly-Si. A doping process for injecting n-type or p-type impurities may be performed in exemplary embodiments in accordance with principles of inventive concepts.

Figure 10A:
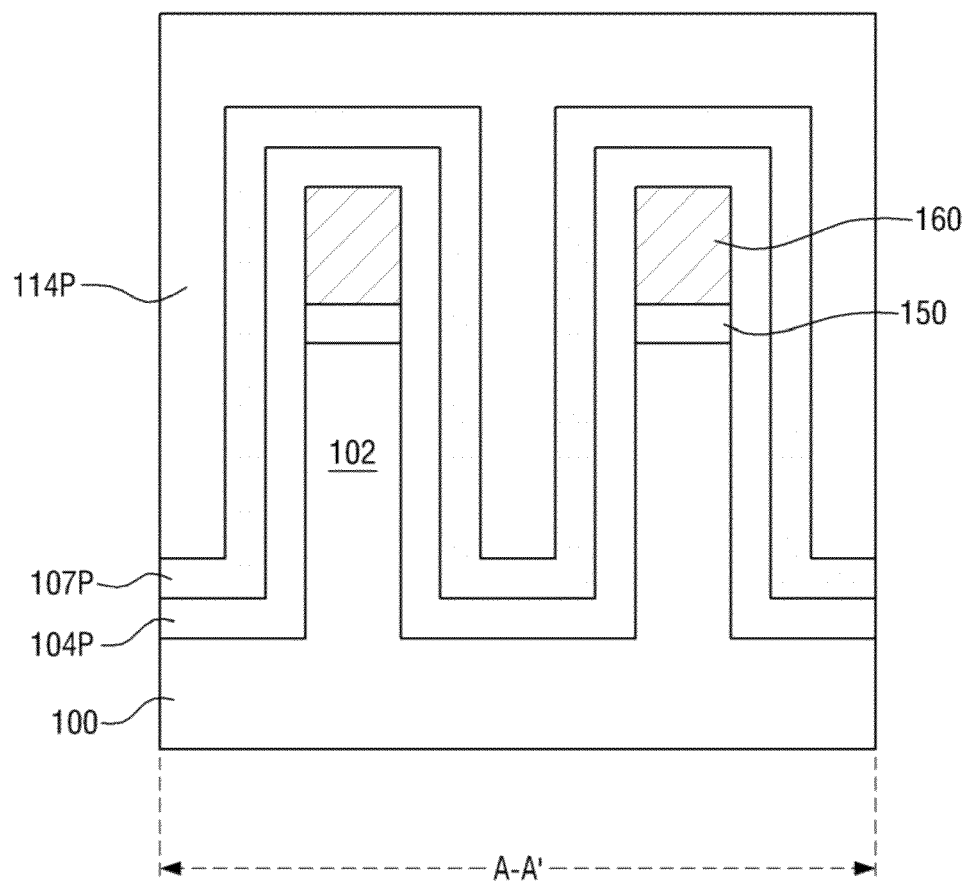
Figure 10B:
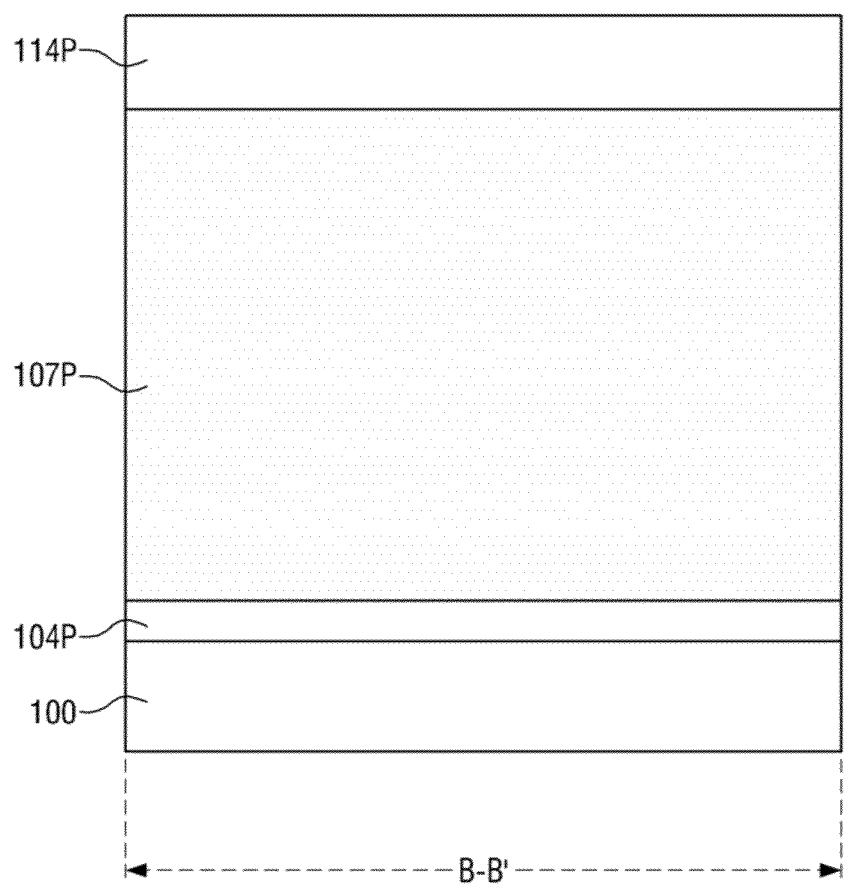

Referring to FIGS. 10A and 10B, floating gate patterns 160, tunnel insulating layer patterns 150, and active patterns 102 may be formed by partially etching the semiconductor material 160P (see FIG. 9A), the tunnel insulating layer 150P (see FIG. 9A), and the pre-substrate 100P.

The floating gate patterns 160, the tunnel insulating layer patterns 150, and the active patterns 102 may be formed to extend along a first direction y (see FIG. 3).

Next, a first liner layer 104P and a second liner layer 107P may be sequentially and conformally formed. Accordingly, in exemplary embodiments in accordance with principles of inventive concepts the first liner layer 104P and the second liner layer 107P may be formed along a top surface of a substrate 100 and side surfaces of the active patterns 102.

The first liner layer 104P may include, for example, an oxide layer. More particularly, in exemplary embodiments in accordance with principles of inventive concepts the first liner layer 104P may include, for example, a SiO2 layer.

The second liner layer 107P may include a material having an etching selectivity with respect to the first liner layer 104P.

The second liner layer 170P may include, for example, a nitride layer. More particularly, in exemplary embodiments in accordance with principles of inventive concepts the second liner layer 107P may include, for example, a SiN layer.

In exemplary embodiments in accordance with principles of inventive concepts, the first liner layer 104P may be omitted, for example.

An insulating layer 114P is formed on the second liner layer 107P. The insulating layer 114P may fill each space between adjacent active patterns 102 and between adjacent floating gate patterns 160, as illustrated in the figures, for example.

The insulating layer 114P may include a material having an etching selectivity with respect to the second liner layer 107P. The insulating layer 114P may include, for example, an oxide layer. In particular, in accordance with principles of inventive concepts the insulating layer 114P may include, for example, a SiO2 layer.

In exemplary embodiments in accordance with principles of inventive concepts, the insulating layer 114P may be formed of, for example, a TOSZ oxide layer. However, inventive concepts are not limited thereto, and the method of forming the insulating layer 114P may be altered from that of this exemplary embodiment.

Figure 11A:
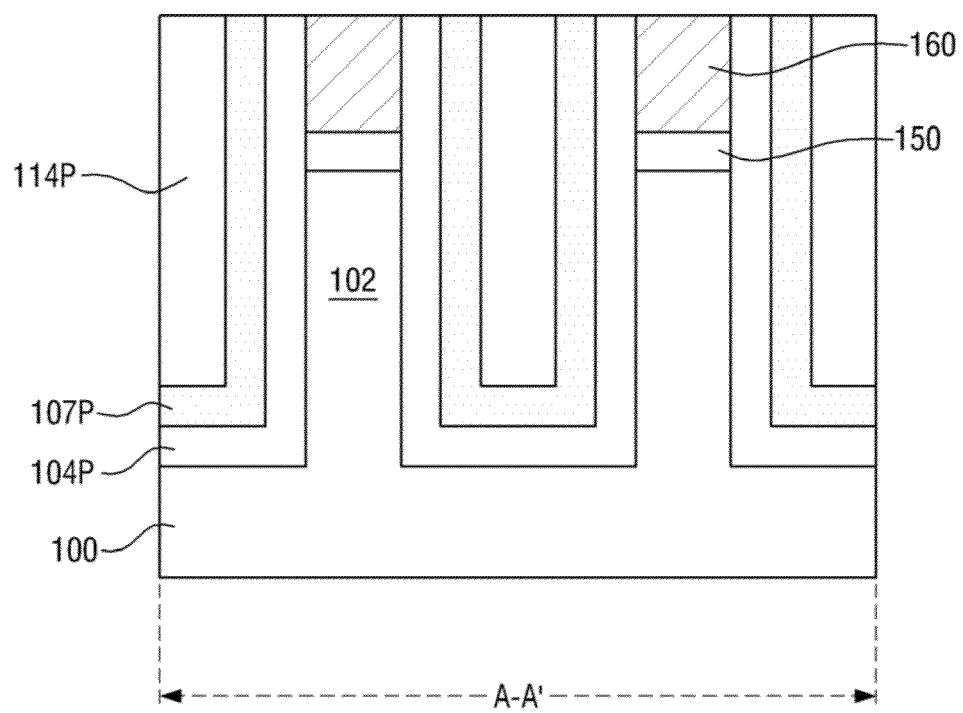
Figure 11B:
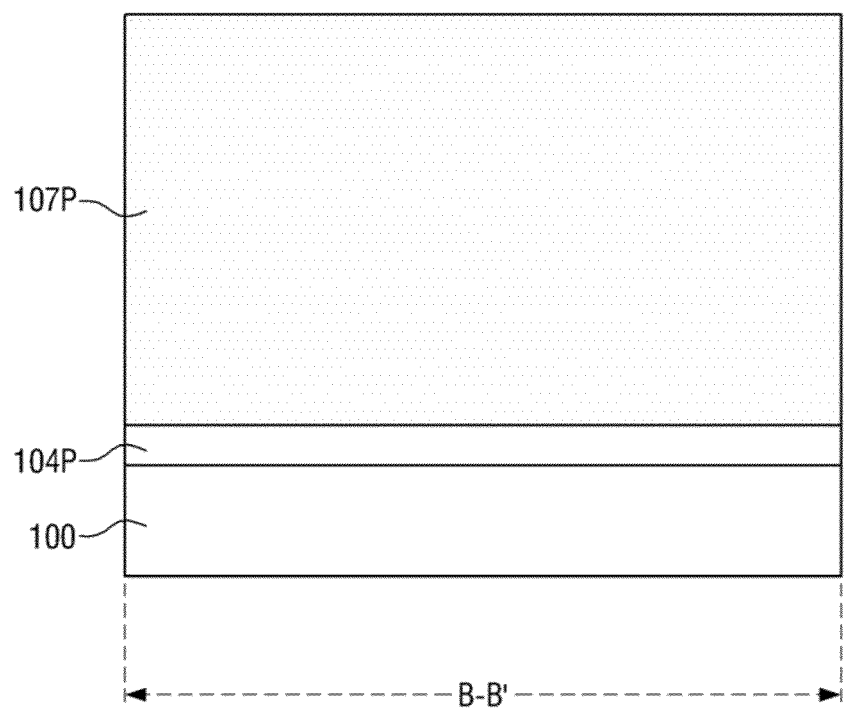

Referring to FIGS. 11A and 11B, the insulating layer 114P is planarized until top surfaces of the floating gate patterns 160 are exposed. In exemplary embodiments in accordance with principles of inventive concepts, the insulating layer 114P may be planarized by, for example, chemical mechanical polishing (CMP).

Figure 12A:
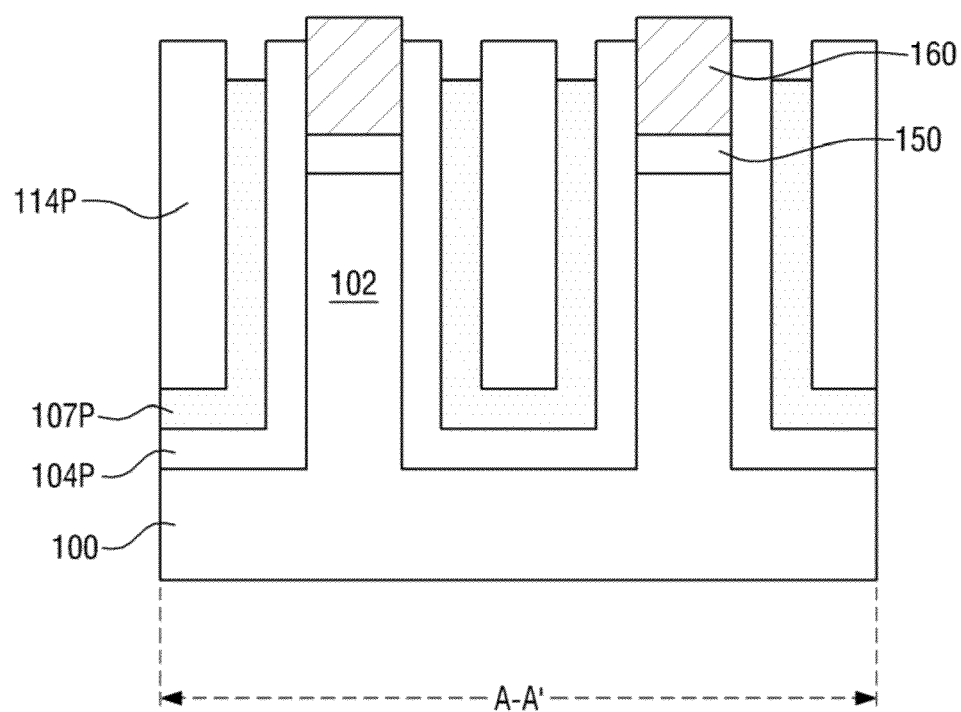
Figure 12B:
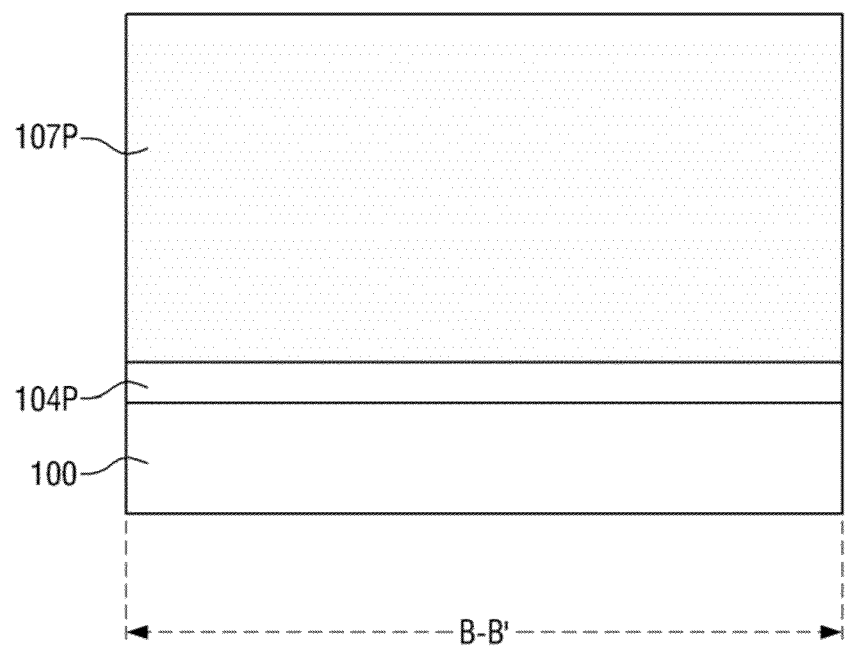

Referring to FIGS. 12A and 12B, in exemplary embodiments in accordance with principles of inventive concepts the first and second liner layers 104P and 107P and the insulating layer 114P may be recessed to partially expose side surfaces of the floating gate patterns 160. Then, the second liner layer 107P may be selectively and isotropically etched using an etchant that has an etching selectivity with respect to the first liner layer 104P and the insulating layer 114P. The etchant may be, for example, phosphoric acid.

Accordingly, in exemplary embodiments in accordance with principles of inventive concepts a top surface of the second liner layer 107P may be formed to be lower than a top surface of the first liner layer 104P and a top surface of the insulating layer 114P.

Figure 13A:
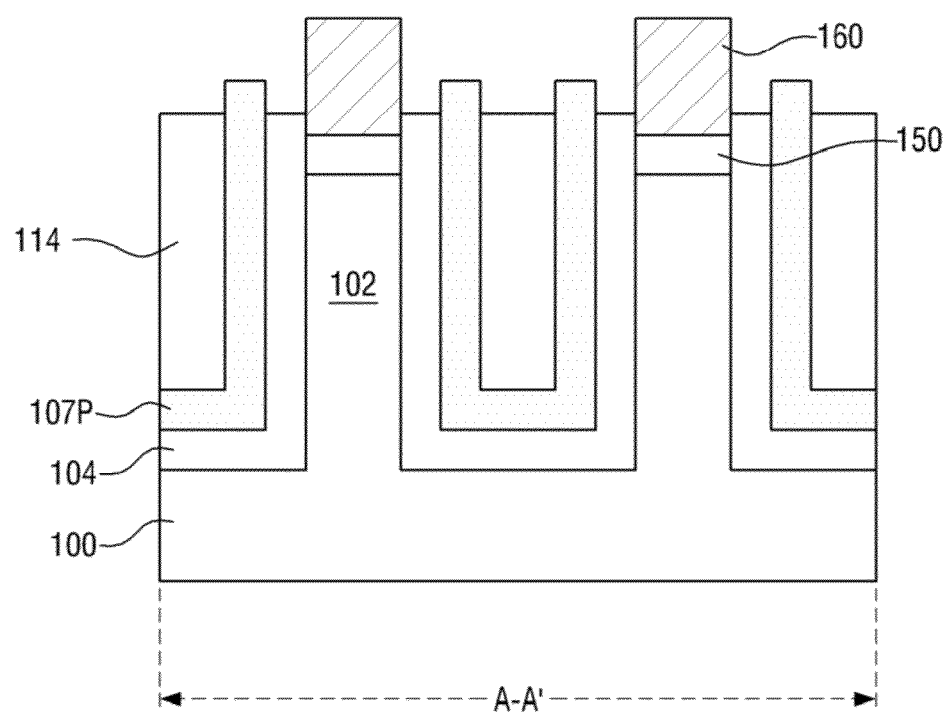
Figure 13B:
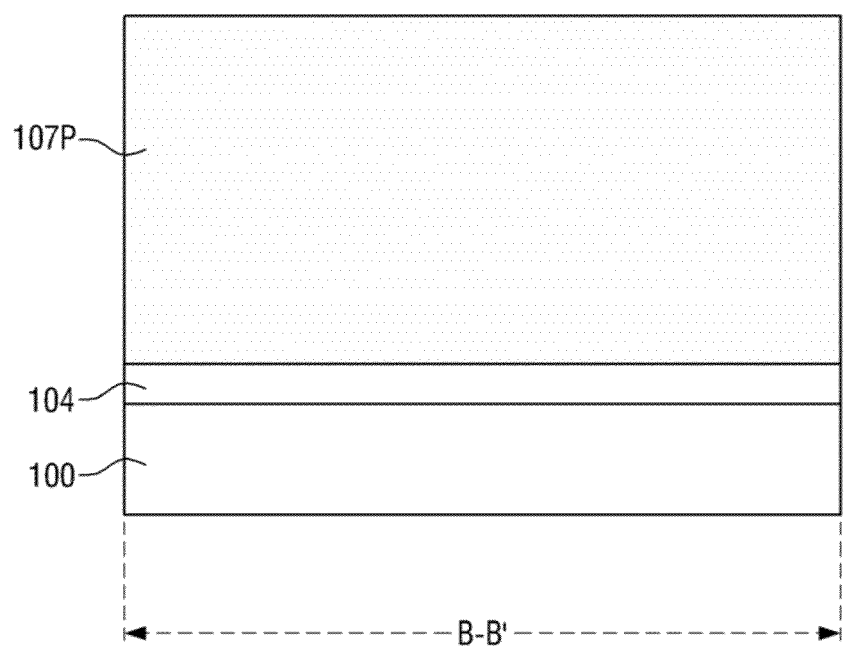

Referring to FIGS. 13A and 13B, the first liner layer 104P and the insulating layer 114P may be selectively etched using an etchant that has an etching selectivity with respect to the second liner layer 107P, thereby forming first liner patterns 104 and insulating layer patterns 114. Accordingly, in exemplary embodiments in accordance with principles of inventive concepts top surfaces of the first liner patterns 104 and top surfaces of the insulating layer patterns 114 may be formed to be lower than the top surface of the second liner layer 107P.

Figure 14A:
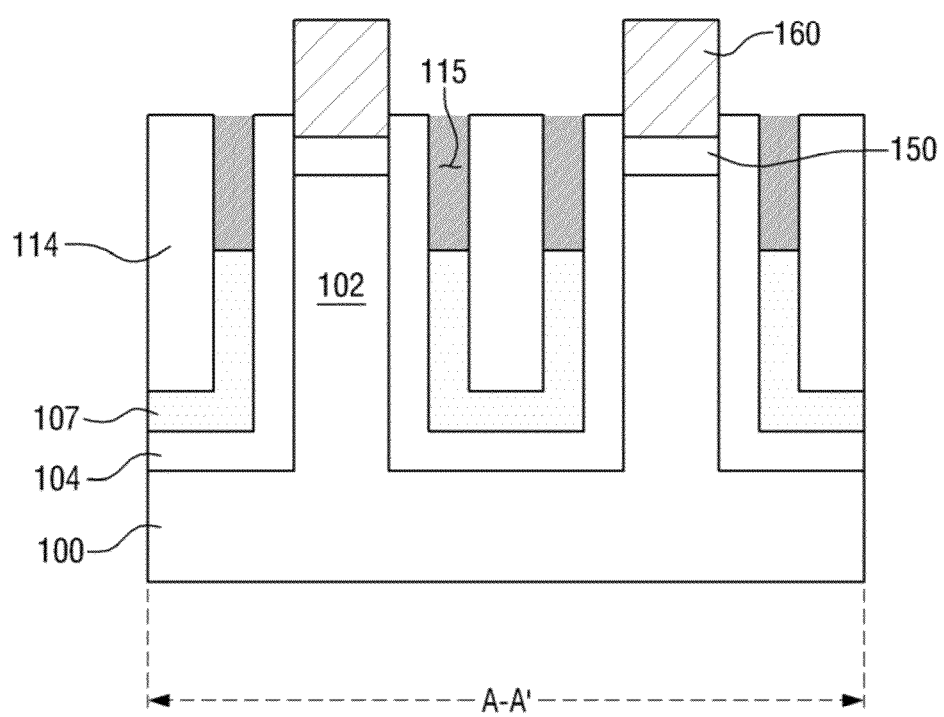
Figure 14B:
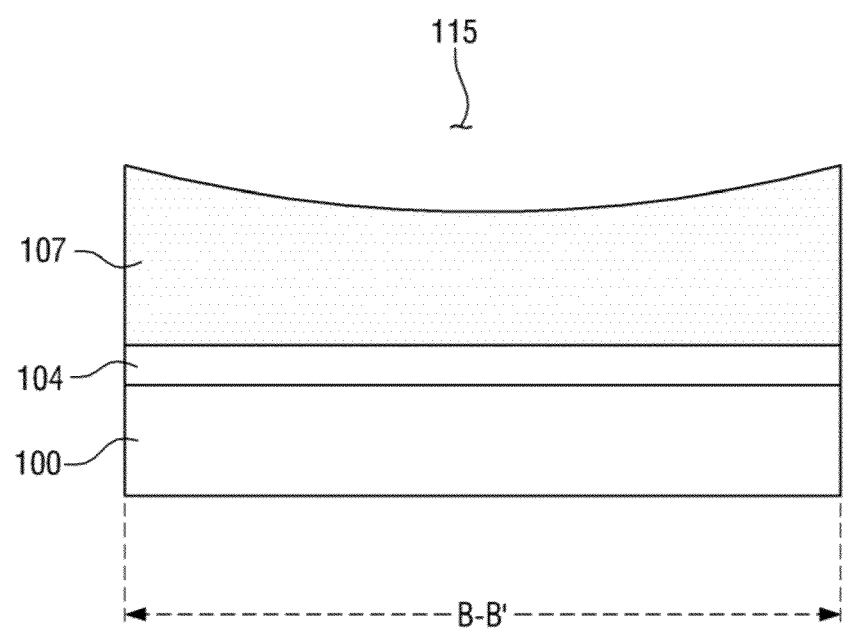

Referring to FIGS. 14A and 14B, the second liner layer 107P may be selectively and isotropically etched using an etchant that has an etching selectivity with respect to the first liner patterns 104 and the insulating layer patterns 114, thereby forming first air gap patterns 115 and second liner patterns 107. The etchant may be, for example, phosphoric acid.

Figure 15A:
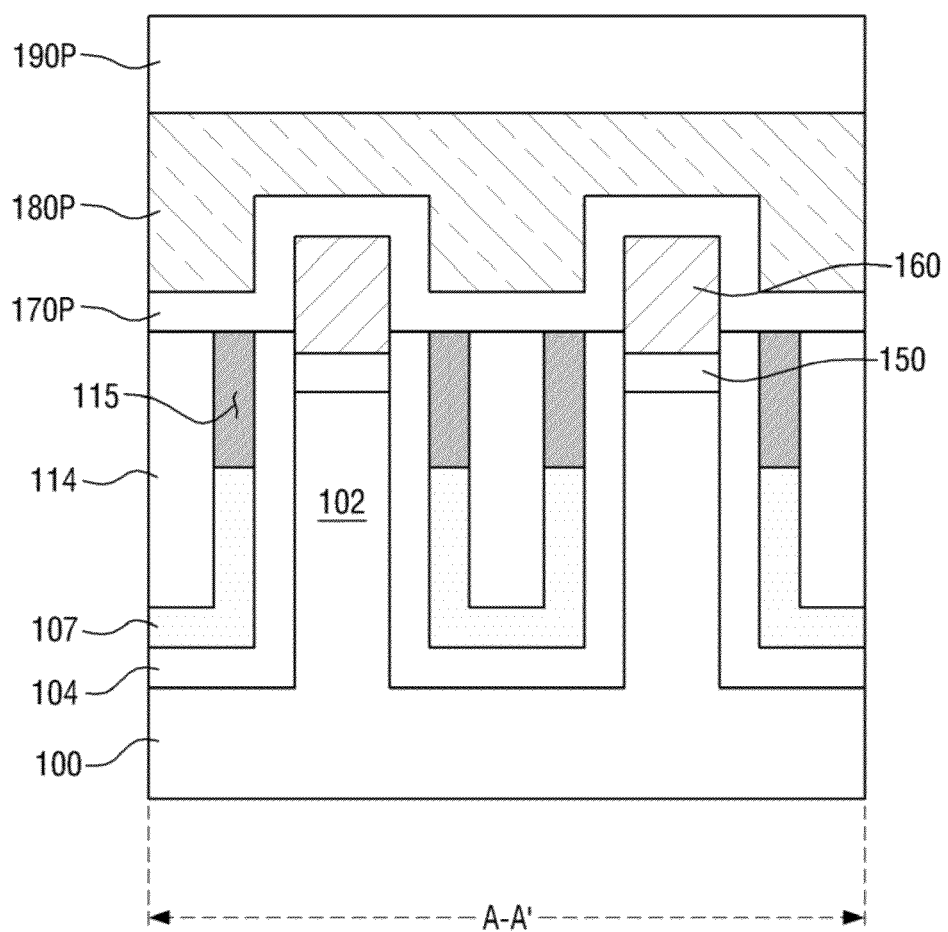
Figure 15B:
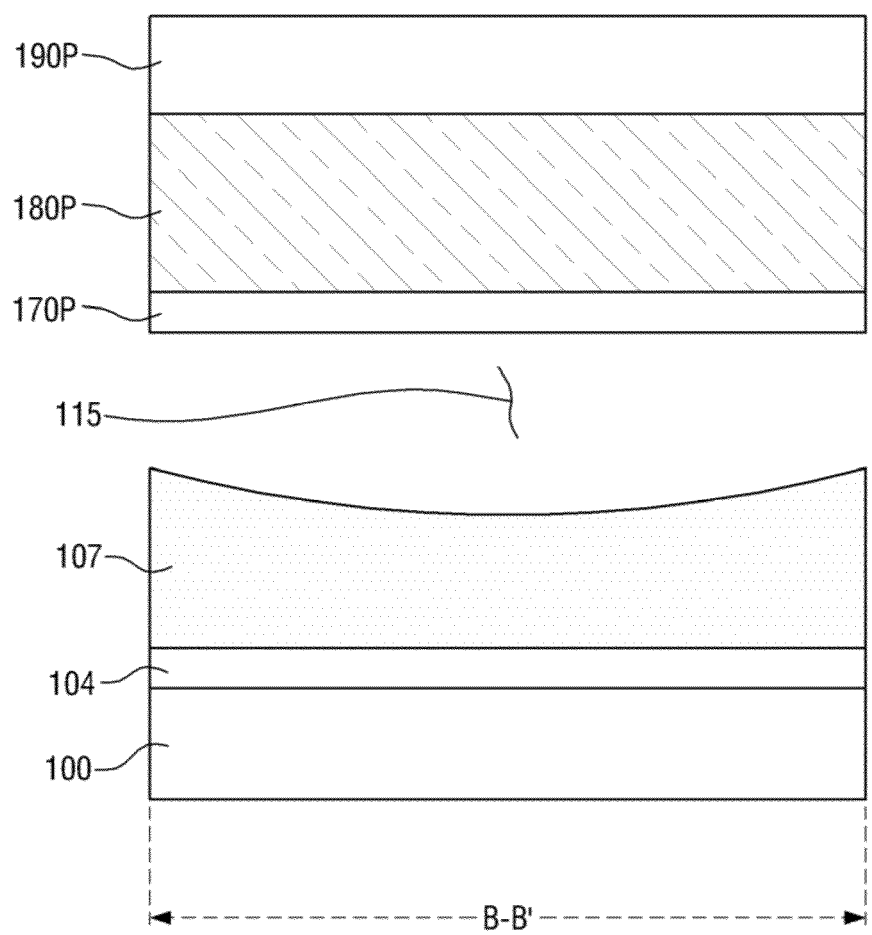

Referring to FIGS. 15A and 15B, a blocking insulating layer 170P, a conductive layer 180P, and a capping layer 190P may be formed sequentially on the insulating layer patterns 114, the first liner patterns 104, and the floating gate patterns 160.

The blocking insulating layer 170P may include, for example, an ONO layer. However, embodiments in accordance with principles of inventive concepts are not limited thereto, and the blocking insulating layer 170P may also include a high dielectric material (for example, an insulating metal oxide such as Al2O3, HfO, etc.) having a higher dielectric constant than the tunnel insulating layer patterns 150.

Figure 16A:
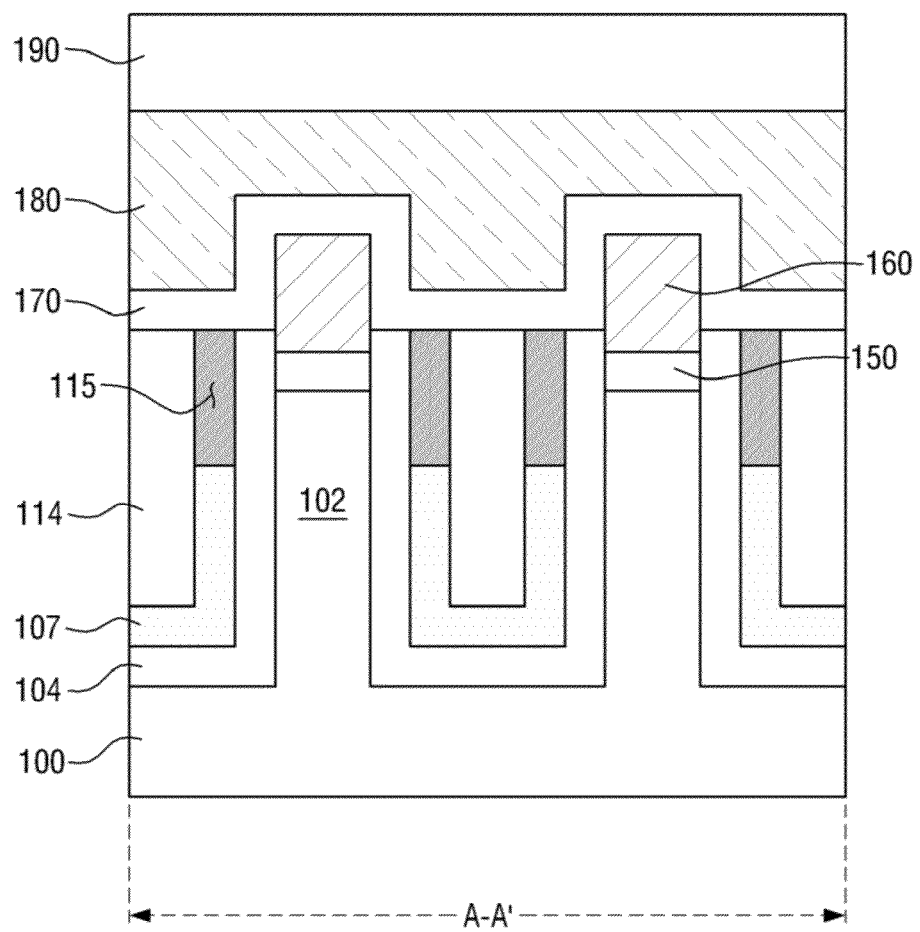
Figure 16B:
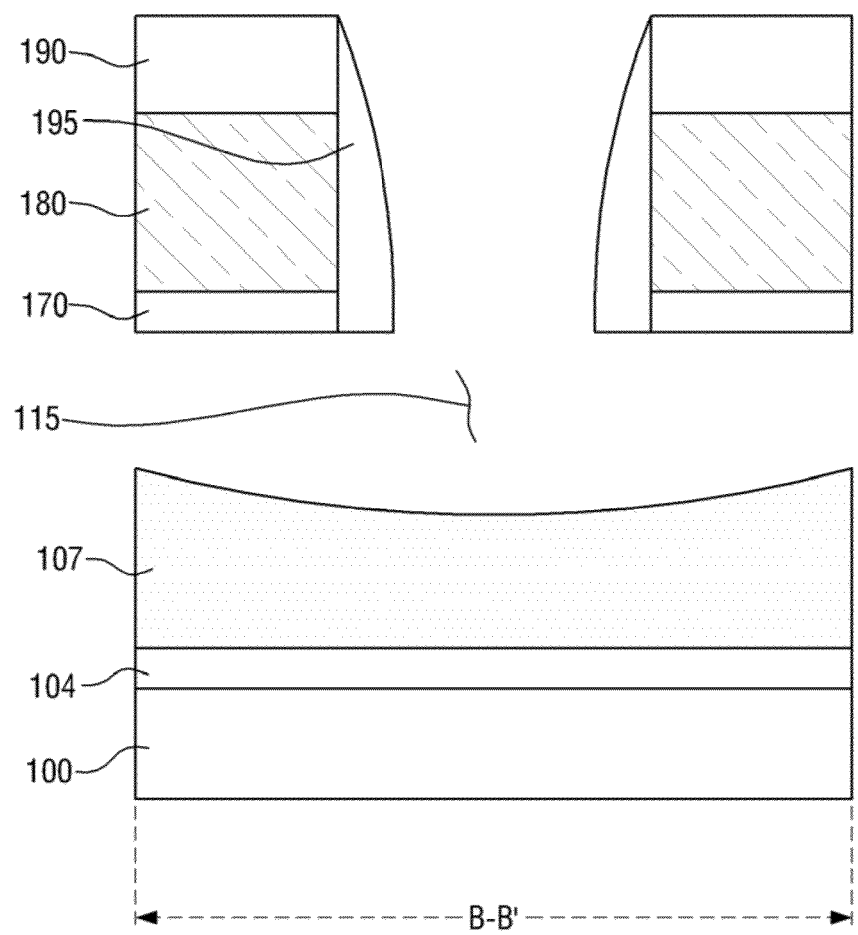

Referring to FIGS. 16A and 16B, blocking insulating layer patterns 170, control gate patterns 180, and capping layer patterns 190 may be formed to extend along a second direction x (see FIG. 3) by etching the blocking insulating layer 170P, the conductive layer 180P, and the capping layer 190P.

Then, spacers 195 may be formed on sidewalls of the blocking insulating layer patterns 170, sidewalls of the control gate patterns 180, and sidewalls of the capping layer patterns 190.

Referring to FIGS. 4A and 4B, an interlayer insulating film 200 may be formed on the capping layer patterns 190 using a method having poor step coverage. Accordingly, in embodiments in accordance with principles of inventive concepts the interlayer insulating film 200 does not completely fill each space between adjacent spacers 195, resulting in the formation of second air gap patterns 125 extending along the second direction x (see FIG. 3).

Figure 17:
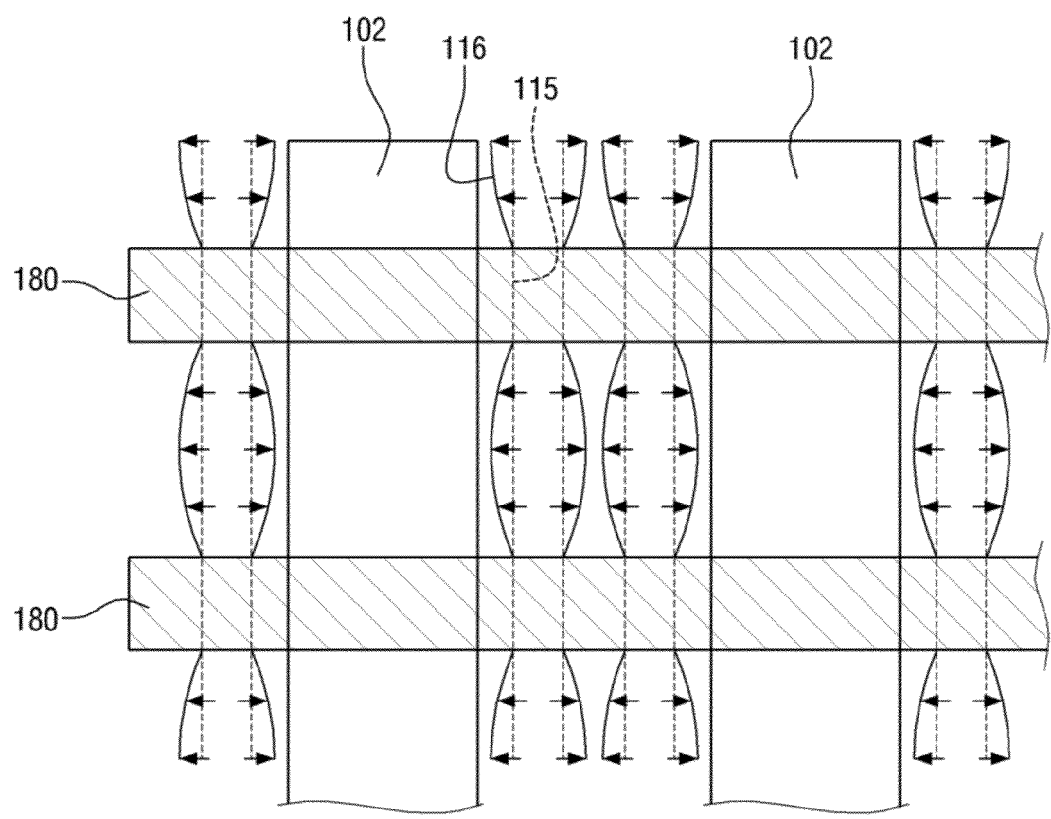
FIG. 17 is a view illustrating steps of a method of fabricating a memory device according to another embodiment of the present invention.

FIG. 17 is a view illustrating steps of a method of fabricating a memory device according to another embodiment of the present invention.

In particular, FIG. 17 is a view of a display device viewed from above after the completion of the processes described above with reference to FIGS. 16A and 16B. For ease of description, capping layer patterns 190 formed on control gate patterns 180 and spacers 195 formed on side surfaces of the control gate patterns 180 are not illustrated in FIG. 17.

Referring to FIG. 17, active patterns 102 extending along a first direction y (see FIG. 3) and control gate patterns 180 extending along a second direction x (see FIG. 3) may partially expose first air gap patterns 115.

In this exemplary embodiment in accordance with principles of inventive concepts, if a top surface of a first liner pattern 104 (see FIG. 4A) disposed on a side of each of the exposed first air gap patterns 115 and a top surface of an insulating layer pattern 114 (see FIG. 4A) disposed on the other side of each of the exposed first air gap patterns 115 are partially etched using an etchant such as hydrogen fluoride (HF), the first air gap patterns 116 whose upper parts are wider than lower parts as illustrated, for example, in FIG. 5A may be formed.

Additionally, if the duration of the etching process is adjusted, the first air gap patterns 117, each having the upper part formed as a single piece and the lower part separated by an insulating layer pattern 114 as illustrated, for example, in FIG. 6A, may be formed.

Figure 18:
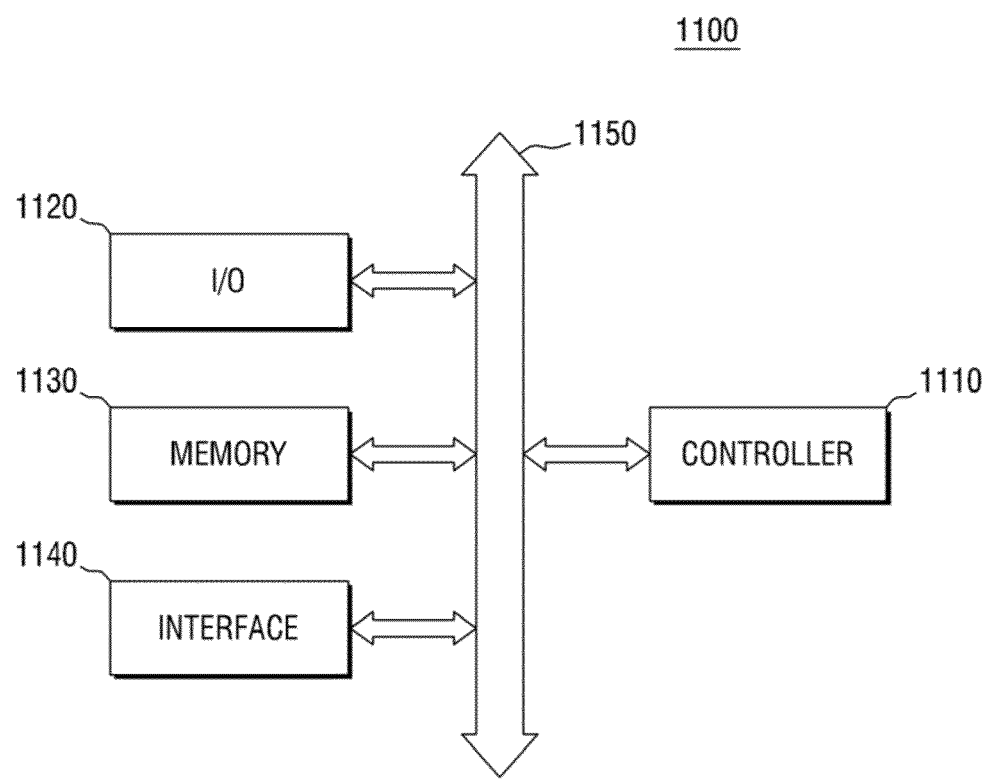
FIG. 18 is a block diagram illustrating an electronic system including a memory device in accordance with principles of inventive concepts.

FIG. 18 is a block diagram illustrating an electronic system 1100 including a memory device in accordance with principles of inventive concepts.

Referring to FIG. 18, the electronic system 1100 in accordance with principles of inventive concepts may include a controller 1110, an input/output (I/O) device 1120, a memory device 1130, an interface 1140 and a bus 1150.

The controller 1110, the I/O device 1120, the memory device 1130 and/or the interface 1140 may be connected to one another by the bus 1150, which may serve as a path for transmitting data.

In exemplary embodiments in accordance with principles of inventive concepts, the bus 1150 may have a multilayer structure. In particular, the bus 1150 may be, for example, a multilayer advanced high-performance bus (AHB) or a multilayer advanced extensible interface (AXI).

The controller 1110 may include a microprocessor, a digital signal processor, a microcontroller or logic devices capable of performing similar functions to those of a microprocessor, a digital signal processor and a microcontroller.

If the electronic system 1100 in accordance with principles of inventive concepts is a system-on-chip (SoC) system, the controller 1110 may perform operations needed to drive the SoC system. In exemplary embodiments in accordance with principles of inventive concepts, the controller 1110 may include a central processing unit (CPU), and the CPU may be configured as a multi-core environment including a plurality of cores, for example.

More specifically, the CPU may include a big cluster including a plurality of big cores and a small cluster including a plurality of small cores, but inventive concepts are not limited thereto.

In exemplary embodiments in accordance with principles of inventive concepts, the controller 110 may be configured to include multimedia system functions. The multimedia system may include a 3D engine module, a video codec, a display system, a camera system, a post-processor, etc.

The I/O device 1120 may include a keypad, a keyboard, a mouse, and a display device, for example.

The memory device 1130 may store data and/or commands. The memory device 1130 may be a memory device in accordance with principles of inventive concepts, such as any of the memory devices according to the above-described embodiments.

The interface 1140 may be used to transmit data to or receive data from a communication network and may be a wired or wireless interface. In exemplary embodiments, the interface 1140 may include an antenna or a wired or wireless transceiver, for example.

Although not illustrated in the figure, the electronic system 1100 may be an operating memory for improving the operation of the controller 1110, which may also include a high-speed dynamic random access memory (DRAM) and/or static random access memory (SRAM), for example.

The electronic system 1100 may be applied to nearly all types of electronic products capable of transmitting or receiving information in a wireless environment, such as a personal digital assistant (PDA), a portable computer, a web tablet, a wireless phone, a mobile phone, a digital music player, a memory card, etc.

Figure 19:
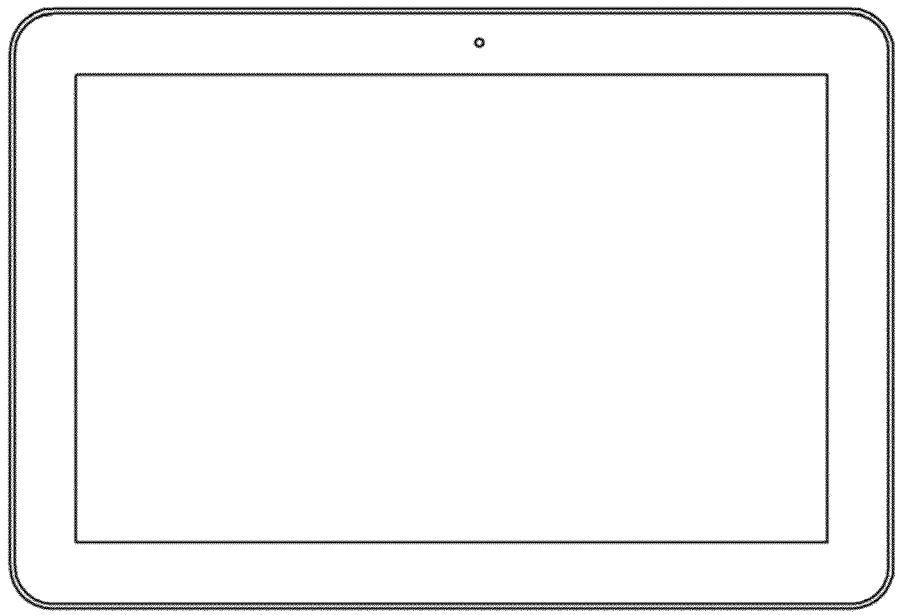
FIGS. 19 through 21 are diagrams illustrating semiconductor devices to which an electronic system in accordance with principles of inventive concepts can be applied.
Figure 20:
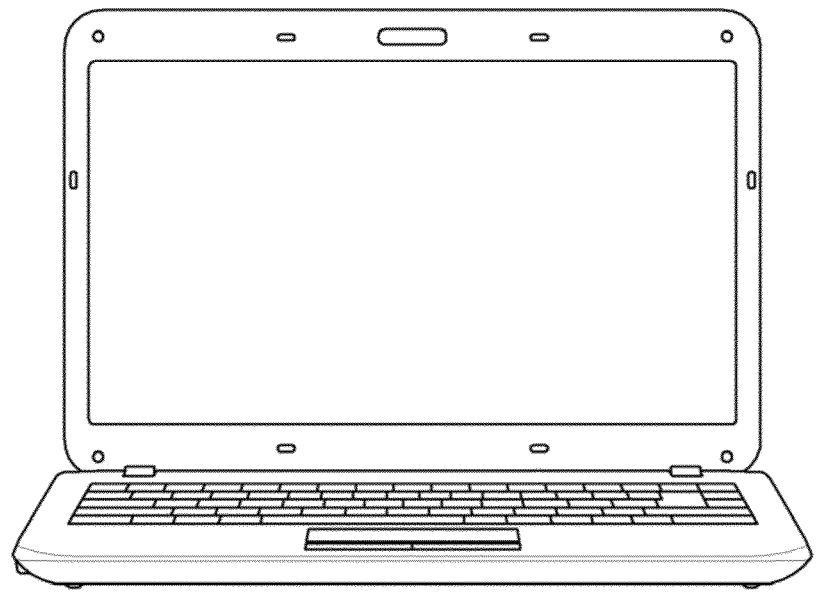
Figure 21:
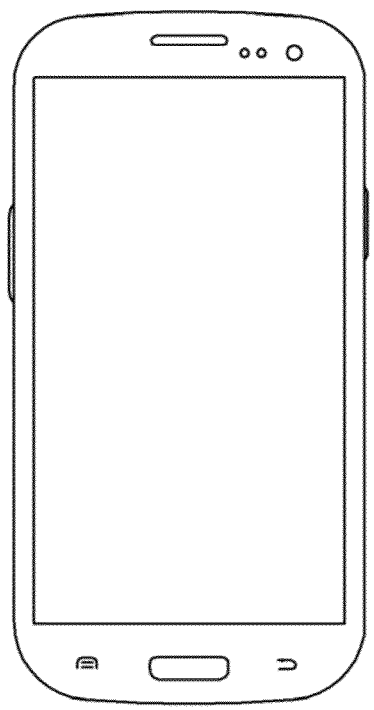

FIGS. 19 through 21 are diagrams illustrating a sample of semiconductor devices to which an electronic system in accordance with principles of inventive concepts may be applied.

FIG. 19 illustrates a tablet personal computer (PC) 1200, FIG. 20 illustrates a notebook computer 1300, and FIG. 21 illustrates a smartphone 1400.

At least one memory device in accordance with principles of inventive concepts may be used in the tablet PC 1200, the notebook computer 1300, and the smartphone 1400.

A memory devices in accordance with principles of inventive concepts may also be applied to various IC devices other than those set forth herein. That is, while the tablet PC 1200, the notebook computer 1300, and the smartphone 1400 have been described above as examples of semiconductor devices according to exemplary embodiments, semiconductor device according to exemplary embodiments are not limited to the tablet PC 1200, the notebook computer 1300, and the smartphone 1400. For example, in exemplary embodiments in accordance with principles of inventive concepts, a semiconductor device in accordance with principles of inventive concepts may be provided as a computer, an Ultra Mobile PC (UMPC), a work station, a net-book computer, a PDA, a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

In concluding the detailed description, those skilled in the art will appreciate that many variations and modifications can be made to exemplary embodiments without substantially departing from the principles of inventive concepts. Therefore, the disclosed exemplary embodiments of inventive concepts are used in a generic and descriptive sense only and not for purposes of limitation.

What is claimed is:

1. A memory device, comprising:
    first and second active patterns that extend parallel to each other along a first direction;
    a tunnel insulating layer pattern and a floating gate pattern that are stacked sequentially on each of the first and second active patterns;
    an insulating layer pattern that fills a space between the first and second active patterns;
    first and second liner patterns formed along side surfaces of the first and second active patterns the second liner pattern having an etching selectivity with respect to the insulating layer pattern;
    a first air gap pattern that is formed on the second liner pattern to extend along the first direction; and
    a blocking insulating layer pattern and a control gate pattern that are stacked sequentially on the floating gate pattern and extend along a second direction intersecting the first direction,
    wherein the first air gap pattern comprises a third air gap pattern that is formed on a first side of the first active pattern and a fourth air gap pattern that is formed on a second side of the second active pattern and is separated from the third air gap pattern by the insulating layer pattern.

2. The memory device of claim 1, wherein the insulating layer pattern comprises an oxide layer pattern, and the second liner pattern comprises a nitride layer pattern.

3. The memory device of claim 2, wherein the oxide layer pattern comprises a silicon oxide (SiO2) layer pattern and the nitride layer pattern comprises a silicon nitride (SiN) layer pattern.

4. The memory device of claim 1, wherein a width of an upper part of the third air gap pattern in the first direction is greater than a width of a lower part of the third air gap pattern in the first direction.

5. The memory device of claim 1, wherein the lower part of the third air gap pattern and a lower part of the fourth air gap pattern are separated from each other by the insulating layer pattern, and the upper part of the third air gap pattern and an upper part of the fourth air gap pattern are formed as a single piece.

6. The memory device of claim 1, further comprising:
    third and fourth active patterns that extend parallel to each other along the first direction and have the insulating layer pattern formed therebetween;
    a fifth air gap pattern that extends along the first direction on a first side of the third active pattern; and
    a sixth air gap pattern that extends along the first direction on a second side of the fourth active pattern,
    wherein a lower part of the fifth air gap pattern and a lower part of the sixth air gap pattern are separated from each other by the insulating layer pattern, and an upper part of the fifth air gap pattern and an upper part of the sixth air gap pattern are formed as a single piece.

7. The memory device of claim 6, wherein a width of the upper part of the fourth air gap pattern is greater than a width of the lower part of the fourth air gap pattern.

8. The memory device of claim 1, further comprising: third and fourth active patterns that extend parallel to each other along the first direction and have the insulating layer pattern formed therebetween; the second liner pattern is formed along side surfaces of the third and fourth active patterns and that has an etching selectivity with respect to the insulating layer pattern; and a second air gap pattern that is formed on the second liner pattern to extend along the first direction, wherein the first and second liner patterns are different from each other, and a size of the first and second air gap patterns are different from each other.

9. The memory device of claim 1, wherein the first liner pattern that is formed between the first and second active patterns and the second liner pattern and along the side surfaces of the first and second active patterns, wherein the first liner pattern and the second liner pattern comprise different materials.

10. The memory device of claim 9, wherein the second liner pattern comprises a nitride layer pattern, and the first liner pattern comprises an oxide layer pattern.

11. The memory device of claim 1, further comprising:
an interlayer insulating film that covers top surfaces of the control gate patterns; and
a second air gap pattern that extends along the second direction between the control gate pattern and another adjacent control gate pattern and intersects the first air gap pattern.

12. A memory device, comprising:
first and second active patterns that extend parallel to each other along a first direction;
a tunnel insulating layer pattern and a floating gate pattern that are stacked sequentially on each of the first and second active patterns;
an insulating layer pattern that partially fills a space between the first and second active patterns;
air gap patterns that extend along the first direction between the first and second active patterns and are separated from each other by the insulating layer pattern; and
a blocking insulating layer pattern and a control gate pattern that are stacked sequentially on the floating gate pattern and extend along a second direction intersecting the first direction.

13. The memory device of claim 12, wherein a width of an upper part of each of the air gap patterns in the first direction is greater than a width of a lower part of each of the air gap patterns in the first direction.

14. The memory device of claim 13, wherein the lower parts of the air gap patterns are separated from each other by the insulating layer pattern, and the upper parts of the air gap patterns are not separated from each other by the insulating layer pattern.

15. The memory device of claim 12, further comprising a liner pattern that is formed along side surfaces of the first and second active patterns and has an etching selectivity with respect to the insulating layer pattern, wherein the air gap patterns are formed on the liner pattern.

16. The memory device of claim 15, wherein the liner pattern is disposed on bottom surfaces of the air gap patterns, and the insulating layer pattern is disposed on respective side surfaces of the air gap patterns.

17. The memory device of claim 16, further comprising an oxide layer pattern that is formed between the first and second active patterns and the liner pattern and along the side surfaces of the first and second active patterns, wherein the oxide layer pattern is disposed on the other respective side surfaces of the air gap patterns.

* * * * *